(12) United States Patent
Nakamura

(10) Patent No.: US 9,899,444 B2
(45) Date of Patent: Feb. 20, 2018

(54) SOLID-STATE IMAGE CAPTURING DEVICE AND MANUFACTURING METHOD FOR THE SAME

(71) Applicant: SEIKO EPSON CORPORATION, Tokyo (JP)

(72) Inventor: Noriyuki Nakamura, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/939,664

(22) Filed: Nov. 12, 2015

(65) Prior Publication Data

US 2016/0148968 A1    May 26, 2016

(30) Foreign Application Priority Data

Nov. 25, 2014  (JP) ................................. 2014-237775

(51) Int. Cl.
*H01L 27/146* (2006.01)

(52) U.S. Cl.
CPC .... *H01L 27/14643* (2013.01); *H01L 27/1463* (2013.01); *H01L 27/14609* (2013.01); *H01L 27/14689* (2013.01)

(58) Field of Classification Search
None
See application file for complete search history.

(56) References Cited

U.S. PATENT DOCUMENTS

| 6,201,268 | B1 | 3/2001 | Nakashiba |
| 7,813,152 | B2 | 10/2010 | Noda et al. |
| 8,450,728 | B2* | 5/2013 | Yamaguchi ....... H01L 27/14603 257/40 |
| 8,854,518 | B2* | 10/2014 | Oike ................. H01L 27/14609 348/297 |
| 9,077,920 | B2* | 7/2015 | Suzuki ................. H04N 5/3572 |
| 9,165,972 | B2* | 10/2015 | Suess ................ H01L 27/14643 |

(Continued)

FOREIGN PATENT DOCUMENTS

| JP | S58-009363 A | 1/1983 |
| JP | S62-033463 A | 2/1987 |

(Continued)

*Primary Examiner* — Hoang-Quan Ho
(74) *Attorney, Agent, or Firm* — Oliff PLC

(57) ABSTRACT

A solid-state image capturing device according to the present invention includes: a first-conductivity-type well; a first second-conductivity-type diffusion layer that is provided in the first-conductivity-type well and generates carriers upon being irradiated with light; a second second-conductivity-type diffusion layer that is provided in the first-conductivity-type well and stores carriers that are generated in the first second-conductivity-type diffusion layer and are transmitted thereto; and a first first-conductivity-type diffusion layer provided below the second second-conductivity-type diffusion layer, wherein an impurity concentration of the second second-conductivity-type diffusion layer is higher than an impurity concentration of the first second-conductivity-type diffusion layer, and an impurity concentration of the first first-conductivity-type diffusion layer is lower than an impurity concentration of the first-conductivity-type well.

12 Claims, 23 Drawing Sheets

(56) References Cited

U.S. PATENT DOCUMENTS

| | | | | |
|---|---|---|---|---|
| 2006/0186315 A1* | 8/2006 | Lee | ................... | H01L 27/14609 250/208.1 |
| 2006/0267053 A1* | 11/2006 | Yang | ................ | H01L 27/14609 257/291 |
| 2008/0296645 A1* | 12/2008 | Itonaga | ............. | H01L 27/14609 257/294 |
| 2010/0309357 A1* | 12/2010 | Oike | ................ | H01L 27/14609 348/302 |
| 2011/0156104 A1* | 6/2011 | Yamaguchi | ....... | H01L 27/14603 257/222 |
| 2013/0270610 A1* | 10/2013 | Suess | ................ | H01L 27/14643 257/258 |
| 2014/0231879 A1* | 8/2014 | Meynants | ......... | H01L 27/14616 257/230 |

FOREIGN PATENT DOCUMENTS

| | | |
|---|---|---|
| JP | H05-243281 A | 9/1993 |
| JP | H05-268526 A | 10/1993 |
| JP | H08-316460 A | 11/1996 |
| JP | 2006-173487 A | 6/2006 |
| JP | 4729393 B2 | 7/2011 |
| JP | 4810806 B2 | 11/2011 |
| JP | 2012-204654 A | 10/2012 |

* cited by examiner

SOLID-STATE IMAGE CAPTURING DEVICE AND MANUFACTURING METHOD FOR THE SAME

BACKGROUND

1. Technical Field

The present invention relates to a solid-state image capturing device and a manufacturing method for the same.

2. Related Art

Heretofore, solid-state image capturing devices such as CCD (Charge Coupled Device) and CMOS (Complementary Metal Oxide Semiconductor) image sensors, for example, have been used in electronic devices provided with an image capturing function, such as digital still cameras and digital video cameras.

For example, a CMOS image sensor is configured in each pixel to transfer a charge from a light-receiving element (photodiode) to a floating diffusion layer, and to read out the potential of the floating diffusion layer using a source follower circuit.

For example, JP-A-8-316460 discloses that by providing a p$^-$-type impurity layer whose impurity concentration is sufficiently lower than that of a p-well, the width of a depletion layer in a p-n junction is increased and the capacitance of a floating diffusion layer is reduced. Also, JP-A-8-316460 discloses that by reducing the capacitance of the floating diffusion layer, variation in the potential of the floating diffusion layer is increased and the charge detection sensitivity is increased.

With a solid-state image capturing device in which a photodiode and a floating diffusion layer are formed in the same substrate, the photodiode temporarily stores charges that are generated due to being irradiated with light. It is preferable that the amount of charge that can be stored in the photodiode (maximum storage charge amount) is large. If the maximum storage charge amount of the photodiode decreases, the maximum signal level that can be read out by the source follower circuit with respect to the light used for irradiation decreases, incurring a decrease in the dynamic range in some cases.

SUMMARY

An advantage according to an aspect of the present invention is providing a solid-state image capturing device capable of reducing the capacitance of a floating diffusion layer and suppressing a case in which the maximum storage charge amount of the photodiode decreases. Also, an advantage according to an aspect of the present invention is providing a manufacturing method for the solid-state image capturing device.

The present invention has been made in order to resolve at least part of the foregoing issues, and can be realized using the following aspects or application examples.

APPLICATION EXAMPLE 1

An aspect of the solid-state image capturing device according to the present invention includes:

a first-conductivity-type well;

a first second-conductivity-type diffusion layer that is provided in the first-conductivity-type well and generates carriers upon being irradiated with light;

a second second-conductivity-type diffusion layer that is provided in the first-conductivity-type well and stores carriers that are generated in the first second-conductivity-type diffusion layer and are transferred thereto; and a first first-conductivity-type diffusion layer provided below the second second-conductivity-type diffusion layer, an impurity concentration of the second second-conductivity-type diffusion layer is higher than an impurity concentration of the first second-conductivity-type diffusion layer, and an impurity concentration of the first first-conductivity-type diffusion layer is lower than an impurity concentration of the first-conductivity-type well.

With this kind of solid-state image capturing device, the width of the depletion layer can be increased, and the capacitance of the floating diffusion layer can be reduced. Accordingly, with this kind of solid-state image capturing device, potential variation (conversion gain) when the carriers in the floating diffusion layer are transferred can be increased, and the charge detection sensitivity can be increased. Furthermore, with this kind of solid-state image capturing device, it is possible to suppress a case in which the maximum possible storage amount (maximum storage charge amount) of the carriers in the first second-conductivity-type diffusion layer decreases.

APPLICATION EXAMPLE 2

In Application Example 1, it is possible to include:

a first-conductivity-type element isolation region provided around the first second-conductivity-type diffusion layer and the second second-conductivity-type diffusion layer; and a second first-conductivity-type diffusion layer provided between the first-conductivity-type element isolation region and the second second-conductivity-type diffusion layer, an impurity concentration of the first-conductivity-type element isolation region may be higher than the impurity concentration of the first-conductivity-type well, and an impurity concentration of the second first-conductivity-type diffusion layer may be lower than an impurity concentration of the first-conductivity-type well.

With this kind of solid-state image capturing device, the depletion layer can be extended in a lateral direction, and the capacitance of the floating diffusion layer can be further reduced.

APPLICATION EXAMPLE 3

In Application Example 2, in plan view, the first first-conductivity-type diffusion layer may overlap with the second second-conductivity-type diffusion layer and the second first-conductivity-type diffusion layer.

With this kind of solid-state image capturing device, the number of manufacturing steps can be reduced compared to the case where the first first-conductivity-type diffusion layer, the second first-conductivity-type diffusion layer, and the second second-conductivity-type diffusion layer are formed using respective separate resist layers as masks.

APPLICATION EXAMPLE 4

In any one of Application Examples 1 to 3, it is possible to include a third second-conductivity-type diffusion layer that is provided in the first-conductivity-type well, is located between the first second-conductivity-type diffusion layer and the second second-conductivity-type diffusion layer, and stores carriers that are generated in the first second-conductivity-type diffusion layer and are transferred thereto, an impurity concentration of the third second-conductivity-type diffusion layer may be higher than the impurity concentration of the first second-conductivity-type diffusion layer and lower than the impurity concentration of the second second-conductivity-type diffusion layer, and carriers generated in the first second-conductivity-type diffusion layer may be transferred to the second second-conductivity-type diffusion layer via the third second-conductivity-type diffusion layer.

With this kind of solid-state image capturing device, carriers can be temporarily stored in the third second-conductivity-type diffusion layer, and it is therefore possible to reduce the amount of time it takes to perform readout processing using the source follower circuit.

APPLICATION EXAMPLE 5

In any one of Application Examples 1 to 4, it is possible to include:

a first insulating layer provided on the first-conductivity-type well between the first second-conductivity-type diffusion layer and the second second-conductivity-type diffusion layer; and a first electrode that is provided on the first insulating layer and is for transferring carriers generated in the first second-conductivity-type diffusion layer to the second second-conductivity-type diffusion layer.

With this kind of solid-state image capturing device, carriers generated in the first second-conductivity-type diffusion layer can be transferred to the second second-conductivity-type diffusion layer by the first electrode.

APPLICATION EXAMPLE 6

In any one of Application Examples 1 to 5, it is possible to include:

a second insulating layer provided on the second second-conductivity-type diffusion layer; and a second electrode that is provided on the second insulating layer and is for discharging carriers stored in the second second-conductivity-type diffusion layer.

With this kind of solid-state image capturing device, carriers stored in the second second-conductivity-type diffusion layer can be discharged (reset) by the second electrode.

APPLICATION EXAMPLE 7

In any one of Application Examples 1 to 6, it is possible to include:

a first-conductivity-type surface diffusion layer provided on a surface of the second second-conductivity-type diffusion layer.

With this kind of solid-state image capturing device, the depletion layer can be extended in a lateral direction, and the capacitance of the floating diffusion layer can be further reduced.

APPLICATION EXAMPLE 8

In any one of Application Examples 1 to 7, the second second-conductivity-type diffusion layer may constitute a floating diffusion layer.

With this kind of solid-state image capturing device, the capacitance of the floating diffusion layer can be reduced and it is possible to suppress a case in which the maximum storage charge amount of the photodiode decreases.

APPLICATION EXAMPLE 9

An aspect of the solid-state image capturing device according to the present invention includes:

a first-conductivity-type well;

a first second-conductivity-type diffusion layer that is provided in the first-conductivity-type well and generates carriers upon being irradiated with light;

a second second-conductivity-type diffusion layer that is provided in the first-conductivity-type well and is electrically connected to the first second-conductivity-type diffusion layer; and a first first-conductivity-type diffusion layer provided below the second second-conductivity-type diffusion layer, an impurity concentration of the second second-conductivity-type diffusion layer is higher than an impurity concentration of the first second-conductivity-type diffusion layer, and an impurity concentration of the first first-conductivity-type diffusion layer is lower than an impurity concentration of the first-conductivity-type well.

With this kind of solid-state image capturing device, the capacitance of the floating diffusion layer can be reduced and it is possible to suppress a case in which the maximum storage charge amount of the photodiode decreases.

APPLICATION EXAMPLE 10

An aspect of the manufacturing method for the solid-state image capturing device according to the present invention includes:

forming a first-conductivity-type well in a substrate;

forming a first second-conductivity-type diffusion layer in the first-conductivity-type well;

forming a second second-conductivity-type diffusion layer in the first-conductivity-type well; and forming a first-conductivity-type diffusion layer in the first-conductivity-type well, the first-conductivity-type diffusion layer is formed below the second second-conductivity-type diffusion layer, an impurity concentration of the second second-conductivity-type diffusion layer is higher than an impurity concentration of the first second-conductivity-type diffusion layer, an impurity concentration of the first-conductivity-type diffusion layer is lower than an impurity concentration of the first-conductivity-type well, the first second-conductivity-type diffusion layer generates carriers upon being irradiated with light, and the second second-conductivity-type diffusion layer stores carriers that are generated in the first second-conductivity-type diffusion layer and are transferred thereto.

With this kind of manufacturing method for the solid-state image capturing device, it is possible to manufacture a solid-state image capturing device that can reduce the capacitance of the floating diffusion layer and suppress a case in which the maximum storage charge amount of the photodiode decreases.

APPLICATION EXAMPLE 11

In Application Example 10,
the second second-conductivity-type diffusion layer and the first-conductivity-type diffusion layer may be formed by ion implantation using a common resist layer as a mask.

With this kind of manufacturing method for the solid-state image capturing device, the number of manufacturing steps can be reduced compared to the case where the first first-conductivity-type diffusion layer, the second first-conductivity-type diffusion layer, and the second second-conductivity-type diffusion layer are formed using respective separate resist layers as masks.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the present invention will be described in detail with reference to the drawings. Note that the embodiments described below are not intended to unduly limit the content of the present invention as described in the claims. Also, not all of the configurations described below are essential to the present invention.

1. Solid-State Image Capturing Device

Figure 1:
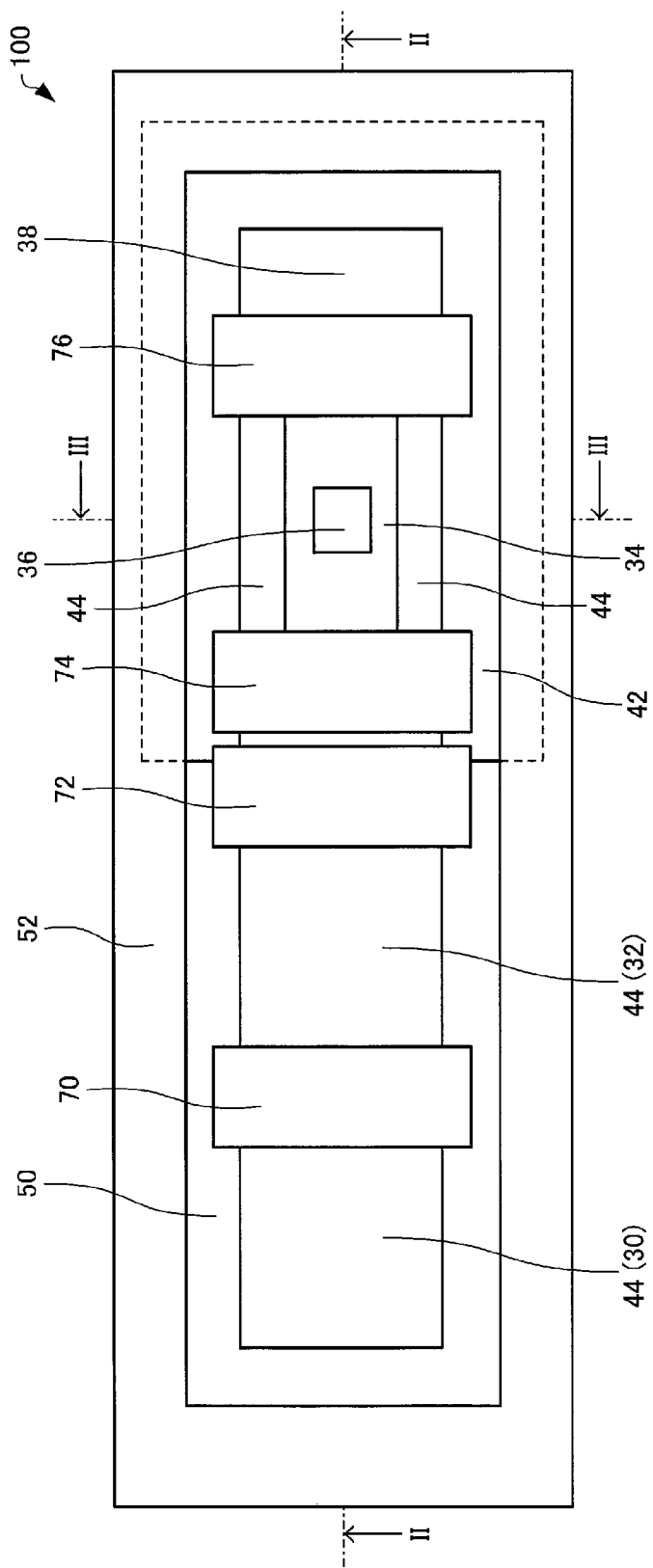
FIG. 1 is a plan view schematically showing a solid-state image capturing device according to an embodiment.
Figure 2:
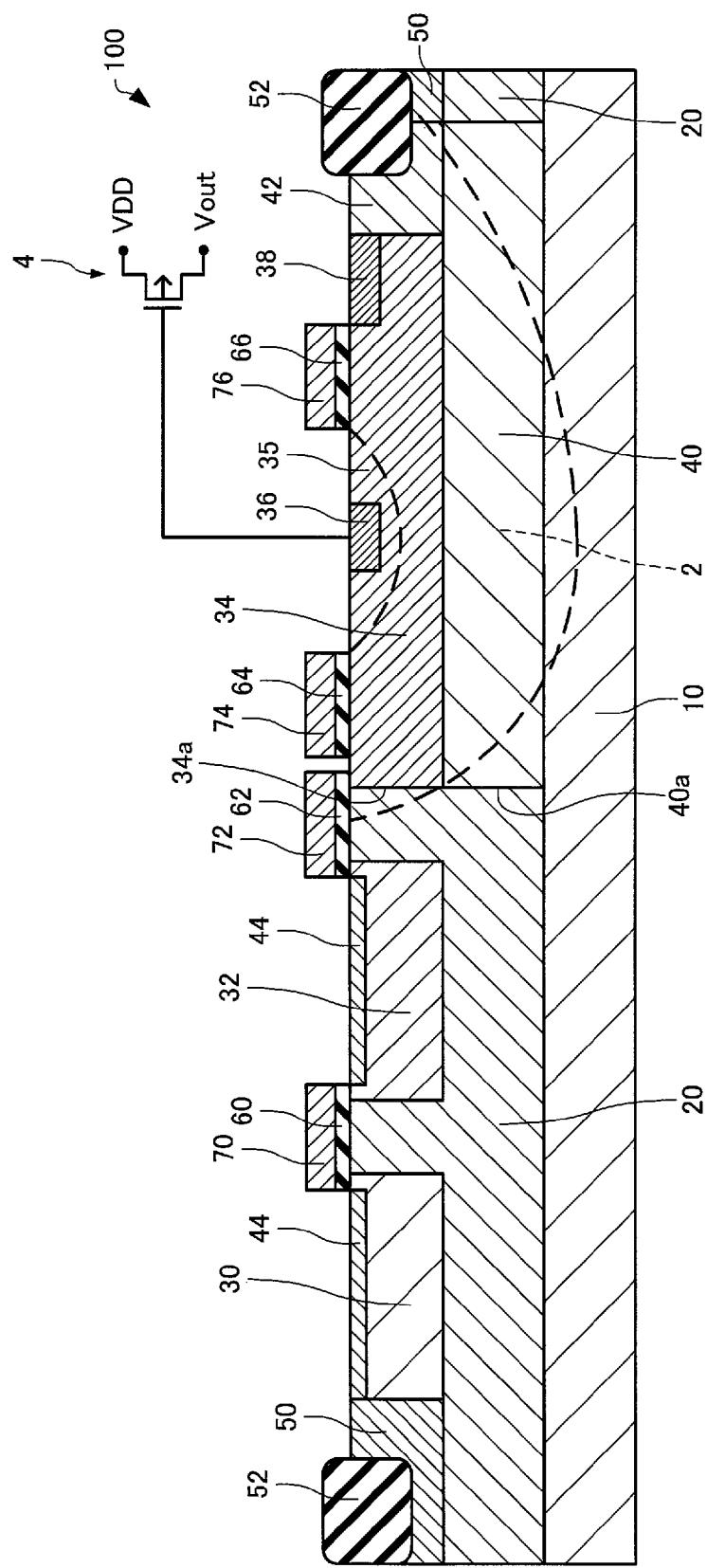
FIG. 2 is a cross-sectional view schematically showing a solid-state image capturing device according to an embodiment.
Figure 3:
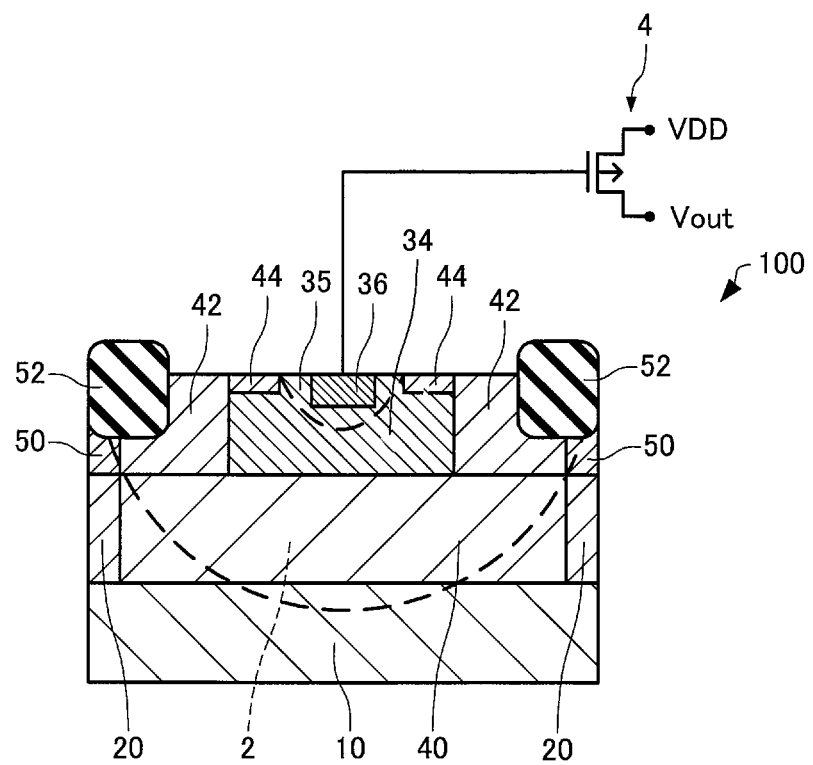
FIG. 3 is a cross-sectional view schematically showing a solid-state image capturing device according to an embodiment.

First, a solid-state image capturing device according to the present embodiment will be described with reference to the drawings. FIG. 1 is a plan view schematically showing a solid-state image capturing device 100 according to the present embodiment. FIG. 2 is a cross-sectional view taken along line II-II in FIG. 1, which schematically shows the solid-state image capturing device 100 according to the present embodiment. FIG. 3 is a cross-sectional view taken along line in FIG. 1, which schematically showing the solid-state image capturing device 100 according to the present embodiment.

As shown in FIGS. 1 to 3, the solid-state image capturing device 100 includes an n-type substrate 10, a p-type well 20, n-type diffusion layers 30, 32, and 34, n-type high-concentration diffusion layers 36 and 38, p-type diffusion layers 40 and 42, a p-type element isolation region 50, an element isolation insulating layer 52, insulating layers 60, 62, 64, and 66, and electrodes 70, 72, 74, and 76.

The n-type substrate 10 is an n-type semiconductor substrate (n-type silicon substrate) formed by adding an impurity such as phosphorus to silicon.

The p-type well (first-conductivity-type well) 20 is provided in the n-type substrate 10. The p-type well 20 is a region composed of a p-type semiconductor formed by adding an impurity such as phosphorus to silicon. The impurity concentration of the p-type well 20 is, for example, $1E16/cm^3$ or more and $1E18/cm^3$ or less.

Here, the impurity concentration of the p-type well (p-type diffusion layer) refers to, in the case where both impurities forming a p type and impurities forming an n type exist in the diffusion layer, the concentration (number) of the impurities forming the p type that remain after the concentration of the impurities forming the n type is subtracted from the concentration of the impurities forming the p type. Similarly, the impurity concentration of the n-type diffusion layer refers to, in the case where impurities forming an n type and impurities forming a p type exist in the diffusion layer, the concentration of impurities forming the n type that remain after the concentration of the impurities forming the p type is subtracted from the concentration of the impurities forming the n type.

The first n-type diffusion layer (first second-conductivity-type diffusion layer) 30 is provided in the first p-type well 20. The first n-type diffusion layer 30 is a region composed of an n-type semiconductor formed by adding an impurity such as phosphorus to silicon, for example. The depth of the first n-type diffusion layer 30 is smaller than the depth of the p-type well 20. The first n-type diffusion layer 30 constitutes a photoelectric conversion element (photodiode). The impurity concentration of the first n-type diffusion layer 30 is, for example, $1E15/cm^3$ or more and $1E17/cm^3$ or less. When the first n-type diffusion layer 30 is irradiated with light, the first n-type diffusion layer 30 generates carriers (electrons, holes) and stores the carriers.

The second n-type diffusion layer (third second-conductivity-type diffusion layer) 32 is provided apart from the n-type diffusion layers 30 and 34 in the first p-type well 20. The second n-type diffusion layer 32 is located between the first n-type diffusion layer 30 and the third n-type diffusion layer 34. The second n-type diffusion layer 32 is a region composed of an n-type semiconductor formed by adding an impurity such as phosphorus to silicon, for example. In the example shown in the drawings, the depth of the second n-type diffusion layer 32 is the same as the depth of the first n-type diffusion layer 30. The impurity concentration of the second n-type diffusion layer 32 is higher than the impurity concentration of the first n-type diffusion layer 30 and lower than the impurity concentration of the third n-type diffusion layer 34. The impurity concentration of the second n-type diffusion layer 32 is, for example, $1E15/cm^3$ or more and $1E17/cm^3$ or less.

The insulating layer (first insulating layer) 60 is provided on the p-type well 20, between the first n-type diffusion layer 30 and the second n-type diffusion layer 32. Furthermore, the insulating layer 60 is provided so as to cover part of the first n-type diffusion layer 30 and part of the second n-type diffusion layer 32. The material of the insulating layer 60 is silicon oxide, for example.

The first transfer electrode (first transfer gate electrode, first electrode) 70 is provided on the insulating layer 60. The material of the first transfer electrode 70 is polysilicon that has been made conductive, for example. The first transfer electrode 70, the insulating layer 60, and the n-type diffusion layers 30 and 32 form a first transfer transistor. Carriers (charges) that are generated in the first n-type diffusion layer 30 and stored in the first n-type diffusion layer 30 are transferred to the second n-type diffusion layer 32 by the first transfer transistor (by the first transfer electrode 70). The second n-type diffusion layer 32 temporarily stores carriers generated in the first n-type diffusion layer 30.

The third n-type diffusion layer (second second-conductivity-type diffusion layer) 34 is provided apart from the n-type diffusion layers 30 and 32 in the p-type well 20. The third n-type diffusion layer 34 is a region composed of an n-type semiconductor formed by adding an impurity such as phosphorus to silicon. In the example shown in the drawing, the depth of the third n-type diffusion layer 34 is the same as the depth of the second n-type diffusion layer 32. The impurity concentration of the third n-type diffusion layer 34 is higher than the respective impurity concentrations of the n-type diffusion layers 30 and 32. The impurity concentration of the third n-type diffusion layer 34 is, for example, $1E15/cm^3$ or more and $1E17/cm^3$ or less.

The third n-type diffusion layer 34 is surrounded by a p-type semiconductor. Specifically, the bottom of the third n-type diffusion layer 34 is in contact with the first p-type diffusion layer 40, and the sides are in contact with the p-type well 20 and the second p-type diffusion layer 42. At the border between the third n-type diffusion layer 34 and the p-type semiconductor, a depletion layer 2 in a p-n junction is formed. In the example shown in the drawing, the depletion layer 2 extends to the n-type substrate 10. Furthermore, the depletion layer 2 is formed below the element isolation insulating layer 52 as well. The region of the third n-type diffusion layer 34 that is surrounded by the depletion layer 2 is a floating diffusion layer 35. That is, the third n-type diffusion layer 34 constitutes the floating diffusion layer 35. The floating diffusion layer 35 is a region that is not fixed at a predetermined voltage.

The insulating layer 62 is provided on the p-type well 20 between the second n-type diffusion layer 32 and the third n-type diffusion layer 34. Furthermore, the insulating layer 62 is provided so as to cover part of the second n-type diffusion layer 32 and part of the third n-type diffusion layer 34. The material of the insulating layer 62 is silicon oxide, for example.

The second transfer electrode (second transfer gate electrode) 72 is provided on the insulating layer 62. The material of the second transfer electrode 72 is polysilicon that has been made conductive, for example. The second transfer electrode 72, the insulating layer 62, and the n-type diffusion layers 32 and 34 constitute a second transfer transistor. Carriers stored in the second n-type diffusion layer 32 are transferred to the floating diffusion layer 35 of the third n-type diffusion layer 34 by the second transfer transistor (by the second transfer electrode 72). Accordingly, the carriers generated in the first n-type diffusion layer 30 are transferred to the floating diffusion layer 35 via the second n-type diffusion layer 32. The transfer electrodes 70 and 72 are electrodes for transferring carriers generated in the first n-type diffusion layer 30 to the floating diffusion layer 35 via the second n-type diffusion layer 32. The floating diffusion layer 35 temporarily stores carriers generated in the first n-type diffusion layer 30.

The first n-type high-concentration diffusion layer 36 is provided in the third n-type diffusion layer 34. The first n-type high-concentration diffusion layer 36 is a region composed of an n-type semiconductor formed by adding an impurity such as phosphorus to silicon. The impurity concentration of the first n-type high-concentration diffusion layer 36 is higher than the impurity concentration of the third n-type diffusion layer 34. The depth of the first n-type high-concentration diffusion layer 36 is smaller than the depth of the third n-type diffusion layer 34. The first n-type high-concentration diffusion layer 36 constitutes the floating diffusion layer 35. A source follower circuit 4 is electrically connected to the first n-type high-concentration diffusion layer 36. The source follower circuit 4 reads out and amplifies the charge (amount of change in the potential of the third n-type diffusion layer 34) of the carriers stored in the third n-type diffusion layer 34 and outputs the resultant signal as an output signal. The source follower circuit 4 is constituted by a transistor and the like. Note that for the sake of convenience, the drawing of the source follower circuit 4 is abbreviated in FIG. 1.

The second n-type high-concentration diffusion layer 38 is provided apart from the first n-type high-concentration diffusion layer 36 in the third n-type diffusion layer 34. The second n-type high-concentration diffusion layer 38 is a region composed of an n-type semiconductor formed by adding an impurity such as phosphorus to silicon. The first n-type high-concentration diffusion layer 36 is provided between the second n-type high-concentration diffusion layer 38 and the second n-type diffusion layer 32. The impurity concentration of the second n-type high-concentration diffusion layer 38 is higher than the impurity concentration of the third n-type diffusion layer 34. In the example shown in the drawing, the depth of the second n-type high-concentration diffusion layer 38 is the same as the depth of the first n-type high-concentration diffusion layer 36. The second n-type high-concentration diffusion layer 38 is electrically connected to a power supply circuit (not shown). The second n-type high-concentration diffusion layer 38 is fixed at a predetermined potential (reset potential) by the power supply circuit, and the potential of the third n-type diffusion layer 34 can be reset (the stored carriers can be discharged).

The insulating layer 64 is provided on the third n-type diffusion layer 34 between the first n-type high-concentration diffusion layer 36 and the second n-type diffusion layer 32. The material of the insulating layer 64 is silicon oxide, for example.

A barrier electrode 74 is provided on the insulating layer 64. The material of the barrier electrode 74 is polysilicon which has been made conductive, for example. The barrier electrode 74 is fixed at a grounding potential (GND). The barrier electrode 74 can create a barrier for when the carriers temporarily stored in the second n-type diffusion layer 32 are transferred to the third n-type diffusion layer 34 by the second transfer electrode 72. Specifically, a potential barrier can be formed by the barrier electrode 74, and a potential valley can be formed in the overlap region between the second transfer electrode 72 and the third n-type diffusion layer 34 (region of overlapping in plan view). This makes it possible to shorten the amount of time for reading out the charge of the carriers in the source follower circuit 4.

The insulating layer (second insulating layer) 66 is provided on the third n-type diffusion layer 34 between the first n-type high-concentration diffusion layer 36 and the second n-type high-concentration diffusion layer 38. The material of the insulating layer 66 is silicon oxide, for example.

The reset electrode (reset gate electrode, second electrode) 76 is provided on the insulating layer 66. The material of the reset electrode 76 is polysilicon that has been made conductive, for example. The reset electrode 76, the insulating layer 66, the floating diffusion layer 35, and the second n-type high-concentration diffusion layer 38 constitute a reset transistor. The carriers stored in the floating diffusion layer 35 are discharged to the power supply circuit (not shown) via the second n-type high-concentration diffusion layer 38 by the reset transistor (by the reset electrode 76). That is to say, the reset electrode 76 is an electrode for discharging the carriers stored in the floating diffusion layer 35.

A first p-type diffusion layer (first first-conductivity-type diffusion layer) 40 is provided in the p-type well 20. The first p-type diffusion layer 40 is provided below the third n-type diffusion layer 34, in contact with the third n-type diffusion layer 34. In the example shown in the drawing, the first p-type diffusion layer 40 is provided in contact with the n-type substrate 10. The impurity concentration of the first p-type diffusion layer 40 is lower than the impurity concentration of the p-type well 20. The impurity concentration of the first p-type diffusion layer 40 is, for example, $1E15/cm^3$ or more and $1E17/cm^3$ or less.

A side face 40a of the first p-type diffusion layer 40 is connected to a side face 34a of the third n-type diffusion layer 34, as shown in FIG. 2. The side faces 34a and 40a are side faces of the diffusion layers 34 and 40 respectively, and are located below the second transfer electrode 72. The first p-type diffusion layer 40 overlaps with the third n-type diffusion layer 34 and the second p-type diffusion layer 42 in plan view (in a view in the thickness direction of the n-type substrate 10). For example, in plan view, the area of the first p-type diffusion layer 40 is the same as the sum of the area of the third n-type diffusion layer 34 and the area of the second p-type diffusion layer 42.

The second p-type diffusion layer 42 is provided in the p-type well 20. The second p-type diffusion layer 42 is provided between the p-type element isolation region 50 and the third n-type diffusion layer 34. The second p-type diffusion layer 42 is a region composed of a p-type semiconductor formed by adding an impurity such as boron to silicon, for example. The second p-type diffusion layer 42 is provided in contact with the third n-type diffusion layer 34. In the example shown in the drawing, the depth of the second p-type diffusion layer 42 is the same as the depth of the third n-type diffusion layer 34. The impurity concentration of the second p-type diffusion layer 42 is lower than the impurity concentration of the p-type well 20. The impurity concentration of the second p-type diffusion layer 42 is higher than the impurity concentration of the first p-type diffusion layer 40, for example. The impurity concentration of the second p-type diffusion layer 42 is, for example, $1E16/cm^3$ or more and $1E18/cm^3$ or less.

P-type surface diffusion layers (first-conductivity-type surface diffusion layers) 44 are provided on the surfaces of the n-type diffusion layers 30 and 32, as shown in FIG. 2. The p-type surface diffusion layers 44 are regions composed of a p-type semiconductor formed by adding an impurity such as boron to silicon, for example. The depths of the p-type surface diffusion layers 44 are smaller than the depths of the n-type diffusion layers 30 and 32. The impurity concentration of the p-type surface diffusion layers 44 is higher than the impurity concentration of the p-type well 20 and lower than the impurity concentration of the p-type element isolation region 50. The impurity concentration of the p-type surface diffusion layers 44 is, for example, $1E17/cm^3$ or more and $1E19/cm^3$ or less. The p-type surface diffusion layers 44 can function as pinning layers that suppress dark currents that occur due to thermally excited carriers that are not caused by light in the n-type diffusion layers 30 and 32.

As shown in FIG. 3, the p-type surface diffusion layers 44 are provided on the surface of the third n-type diffusion layer 34, as shown in FIG. 3. The p-type surface diffusion layers 44 are provided apart from the first n-type high-concentration diffusion layer 36. As shown in FIG. 1, in plan view, the p-type surface diffusion layers 44 are provided such that the first n-type high-concentration diffusion layer 36 is interposed therebetween in a direction orthogonal to the direction extending from the barrier electrode 74 to the reset electrode 76.

The p-type element isolation region 50 is provided in the p-type well 20. The p-type element isolation region 50 is provided around the n-type diffusion layers 30, 32, and 34. That is, the n-type diffusion layers 30, 32, and 34 are provided inside of the p-type element isolation region 50 in plan view. The p-type element isolation region 50 is a region composed of a p-type semiconductor formed by adding an impurity such as boron to silicon, for example. The impurity concentration of the p-type element isolation region 50 is higher than the impurity concentration of the p-type well 20. If an element (for example, an impurity region constituting an element) is provided outside of the p-type element isolation region 50 in plan view, the p-type element isolation region 50 can electrically isolate the element and the n-type diffusion layers 30, 32, and 34.

The element isolation insulating layer 52 is provided in the p-type element isolation region 50. In the example shown in the drawing, the element isolation insulating layer 52 is a LOCOS (local oxidation of silicon) insulating layer, but the element isolation insulating layer 52 may be a semi-recess LOCOS insulating layer or an STI (shallow trench isolation) insulating layer. When an element is provided outside of the element isolation insulating layer 52 in plan view, the element isolation insulating layer 52 can electrically isolate the element and the n-type diffusion layers 30, 32, and 34.

Figure 4:
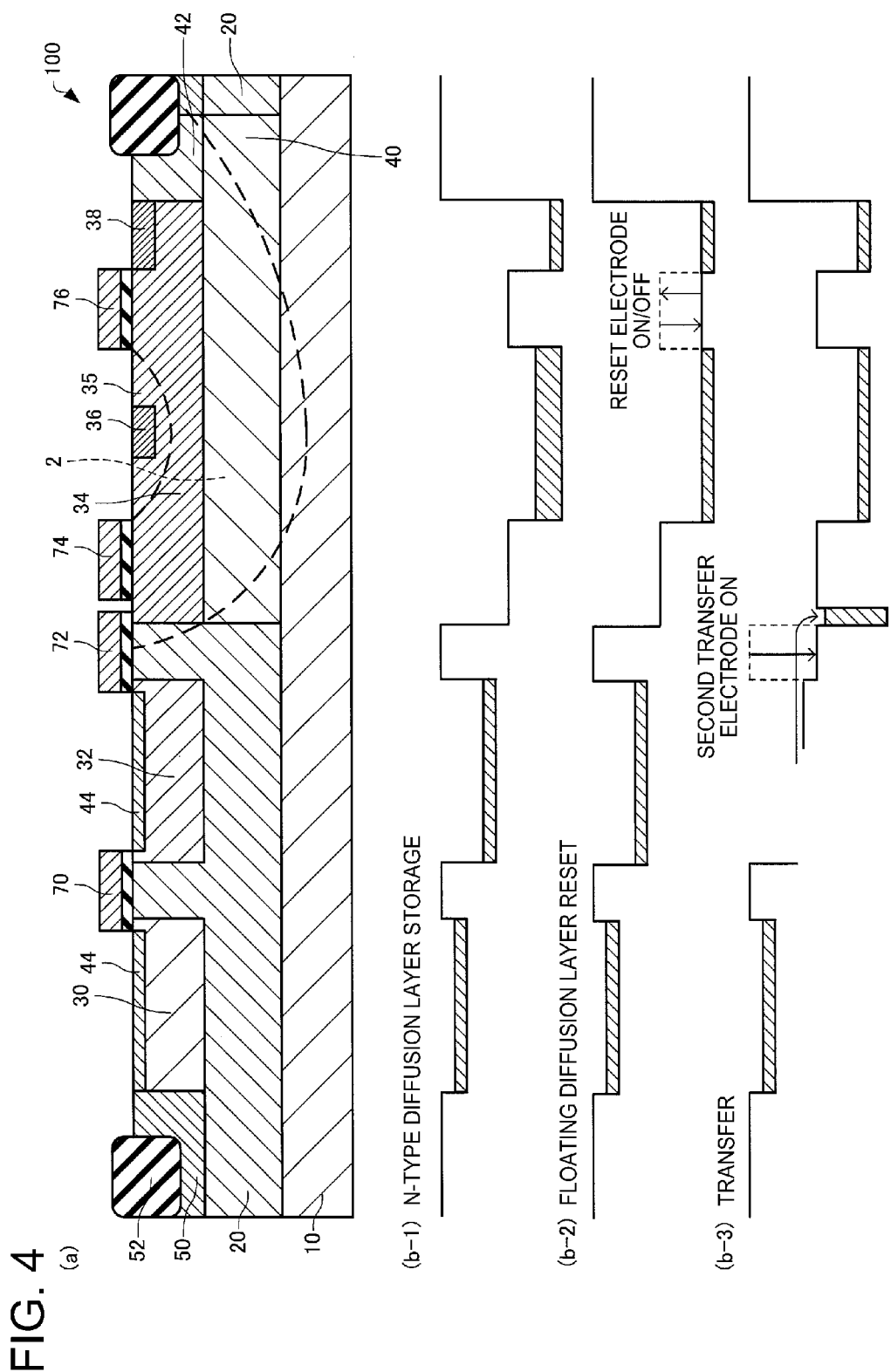
FIG. 4 is a diagram illustrating a charge transfer operation of a solid-state image capturing device according to an embodiment.
Figure 5:
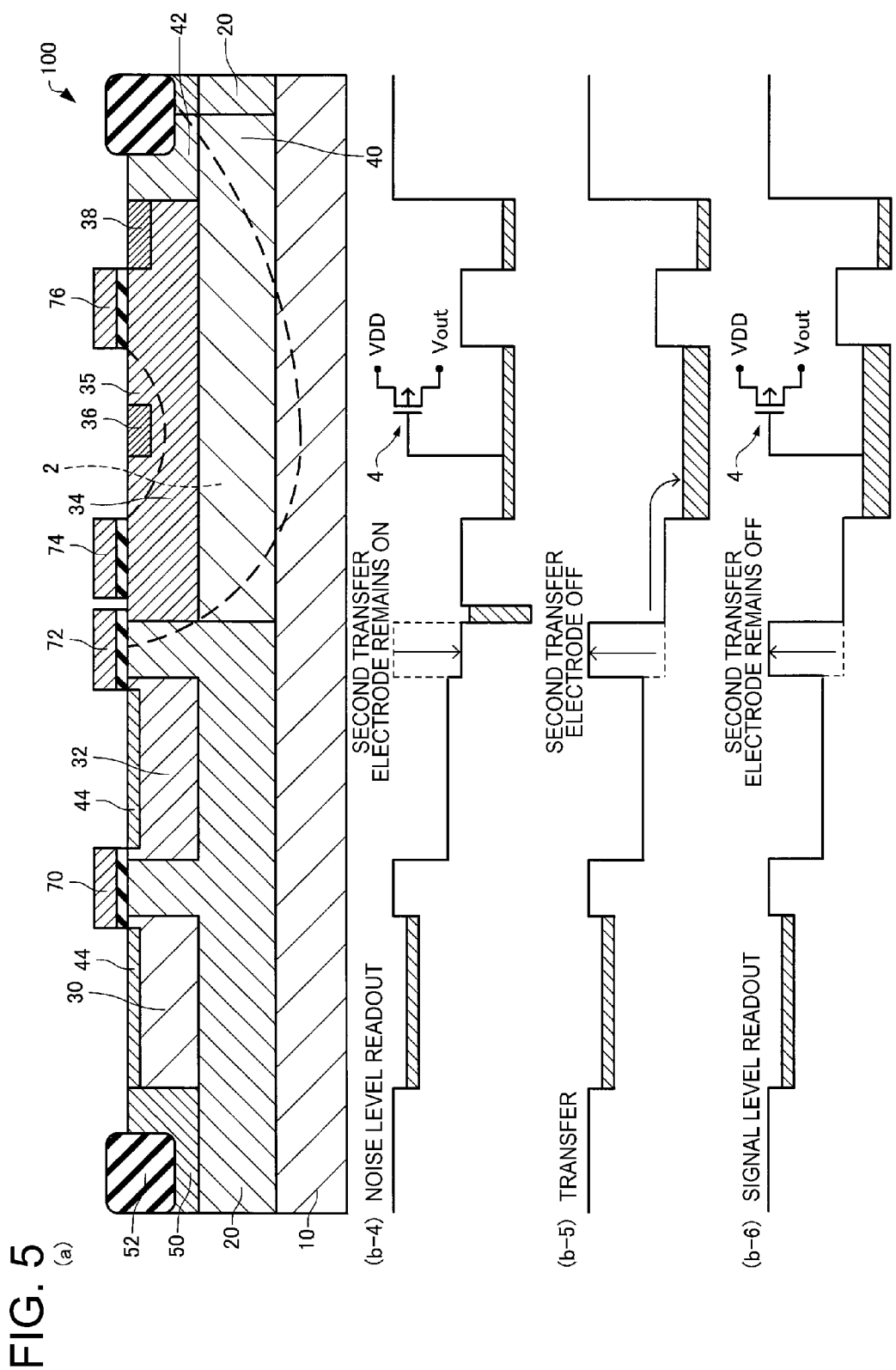
FIG. 5 is a diagram illustrating a charge transfer operation of a solid-state image capturing device according to an embodiment.
Figure 6:
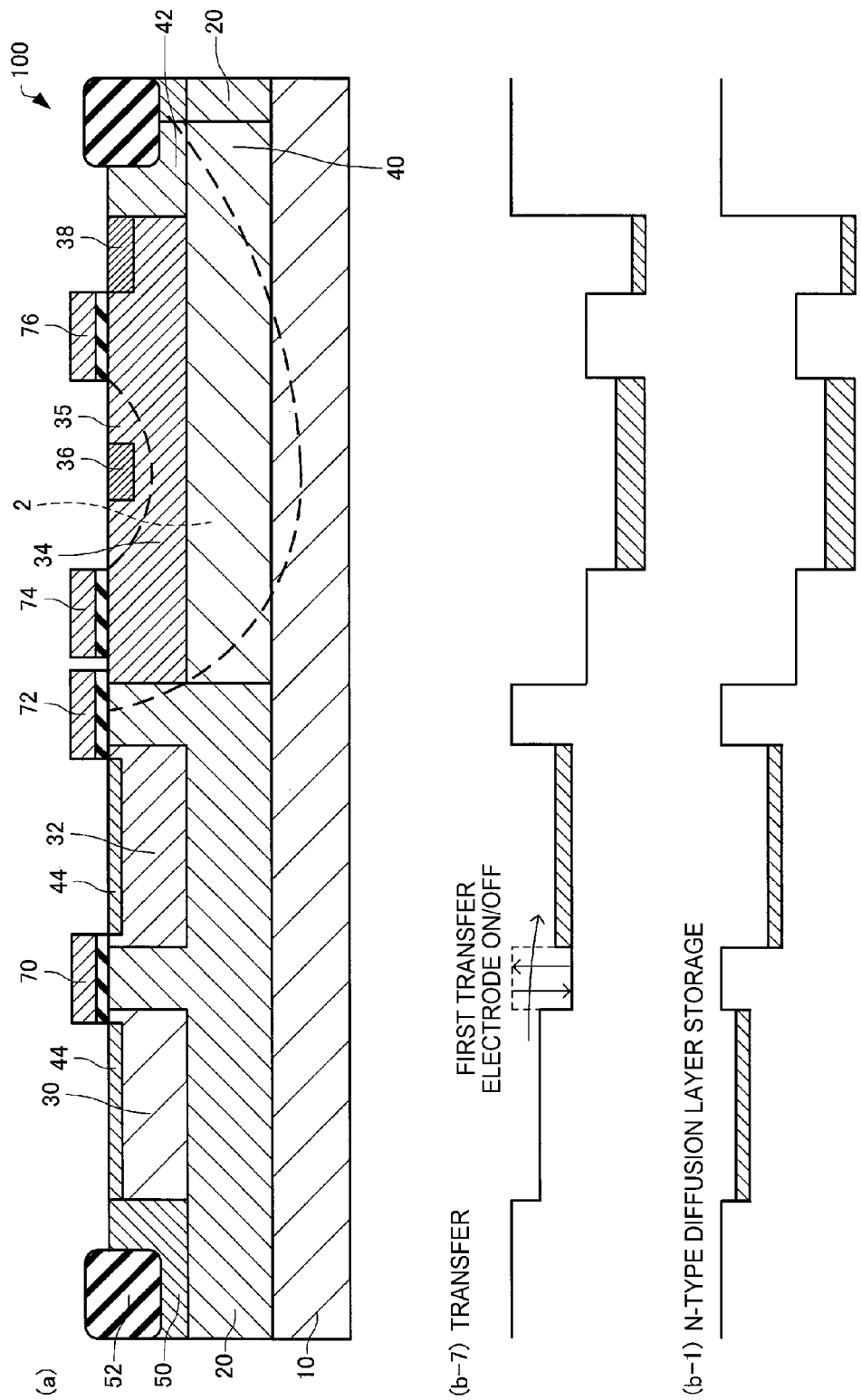
FIG. 6 is a diagram illustrating a charge transfer operation of a solid-state image capturing device according to an embodiment.
Figure 7:
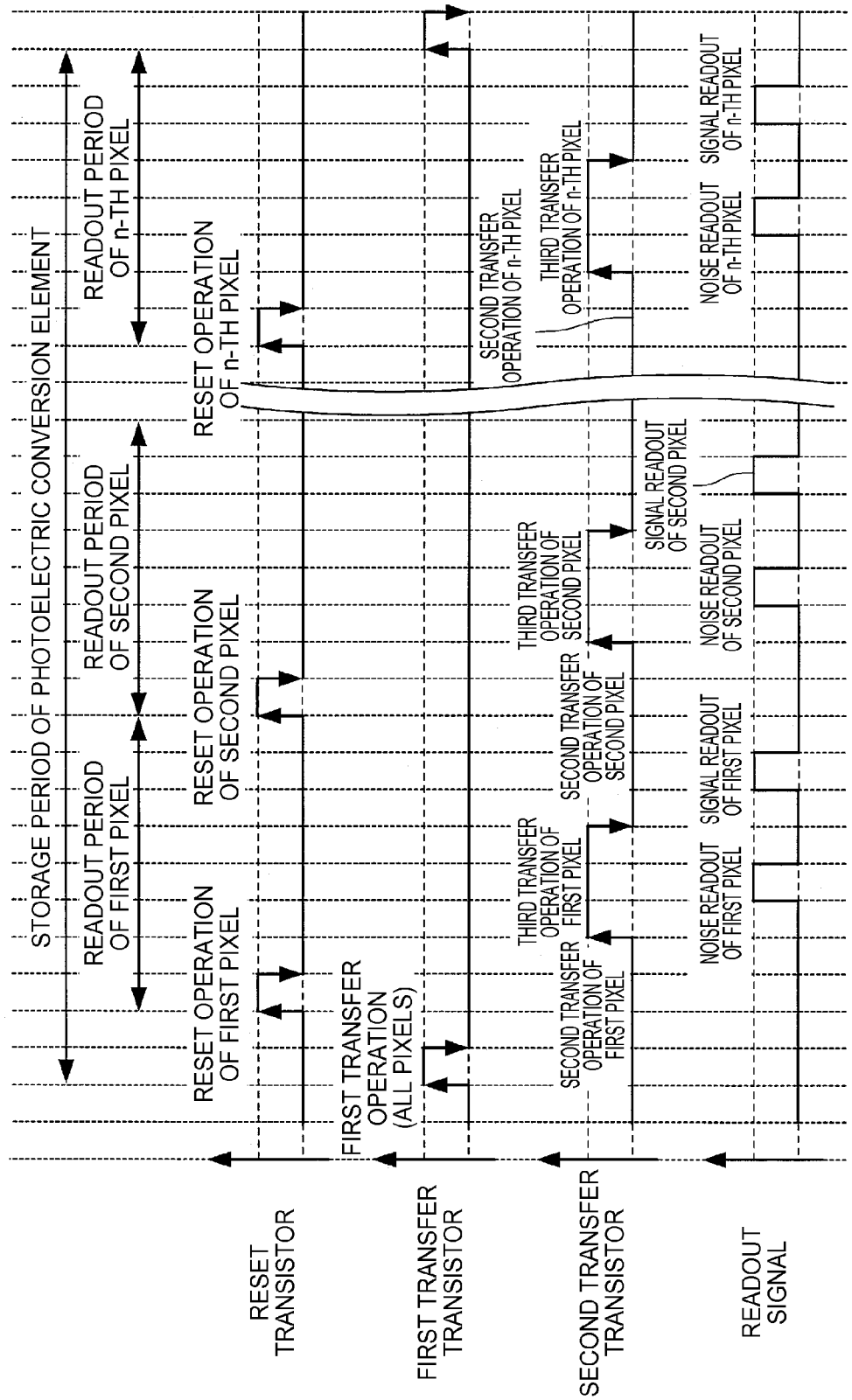
FIG. 7 is a diagram schematically showing a driving sequence illustrating a charge transfer operation of a solid-state image capturing device according to an embodiment.

Next, operations of the solid-state image capturing device 100 will be described with reference to the drawings. FIGS. 4 to 6 are diagrams illustrating a charge transfer operation (carrier transfer operation) of the solid-state image capturing device 100. FIG. 7 is a diagram schematically showing a driving sequence for illustrating the charge transfer operation of the solid-state image capturing device 100. Note that in FIGS. 4 to 6, a cross-sectional view of the solid-state image capturing device 100 is shown schematically in (a), and potential energy (potential) corresponding to the cross section shown in (a) is shown schematically in (b-1) to (b-7). Also, in FIGS. 4 to 6, the carriers are shown schematically with diagonal lines in (b-1) to (b-7).

As shown in FIG. 4, charges (carriers) are stored in the n-type diffusion layers 30 and 32 and the floating diffusion layer 35 (b-1).

Next, by turning on the reset electrode 76 (reset transistor), part of the carriers stored in the floating diffusion layer 35 is transferred to the second n-type high-concentration diffusion layer 38 (b-2). Thereafter, the reset electrode 76 is turned off. This corresponds to a reset operation of a first pixel shown in FIG. 7.

Next, by turning on the second transfer electrode 72 (second transfer transistor), the carriers stored in the second n-type diffusion layer 32 are transferred to the overlap region between the second transfer electrode 72 and the third n-type diffusion layer 34 (b-3). This corresponds to a second transfer operation of a first pixel shown in FIG. 7.

As shown in FIG. 5, the potential level of the floating diffusion layer 35 is read out by the source follower circuit 4 while the second transfer electrode 72 is on, and thus readout of the noise level is performed (b-4). This corresponds to noise readout of a first pixel shown in FIG. 7.

Next, by turning off the second transfer electrode 72, the carriers in the overlap region between the second transfer electrode 72 and the third n-type diffusion layer 34 are transferred to the floating diffusion layer 35 (b-5). This corresponds to a third transfer operation of a first pixel shown in FIG. 7. The barrier electrode 74 is fixed at GND and need not be turned on or off.

Next, the potential level of the floating diffusion layer 35 is read out by the source follower circuit 4 while the second transfer electrode 72 is off, and thereby readout of the signal level is performed (b-6). This corresponds to signal readout of a first pixel shown in FIG. 7.

As shown in FIG. 6, by turning on the first transfer electrode 70 (first transfer transistor), the carriers stored in the first n-type diffusion layer 30 are transferred to the second n-type diffusion layer 32 (b-7). Thereafter, the first transfer electrode 70 is turned off.

Next, the first n-type diffusion layer 30 is irradiated with light, causing carriers to be generated in the first n-type diffusion layer 30 (b-1). The generated carriers are temporarily stored in the first n-type diffusion layer 30. The above-described steps are repeated.

The solid-state image capturing device 100 has the following characteristics, for example.

The solid-state image capturing device 100 includes: a first n-type diffusion layer 30 that is provided in the p-type well 20 and generates carriers upon being irradiated with light; a third n-type diffusion layer 34 that is provided in the p-type well 20 and stores carriers that are generated in the first n-type diffusion layer 30 and are transferred thereto; and a first p-type diffusion layer 40 that is provided below the third n-type diffusion layer 34, and the impurity concentration of the first p-type diffusion layer 40 is lower than the impurity concentration of the p-type well 20. For this reason, in the solid-state image capturing device 100, the width of the depletion layer 2 can be made larger, and the capacitance of the floating diffusion layer 35 can be made smaller, compared with a case where the first p-type diffusion layer 40 is not provided. Accordingly, with the solid-state image capturing device 100, it is possible to increase the potential variation (conversion gain) and to increase the charge detection sensitivity in the case where carriers are transferred from the floating diffusion layer 35.

Figure 8A:
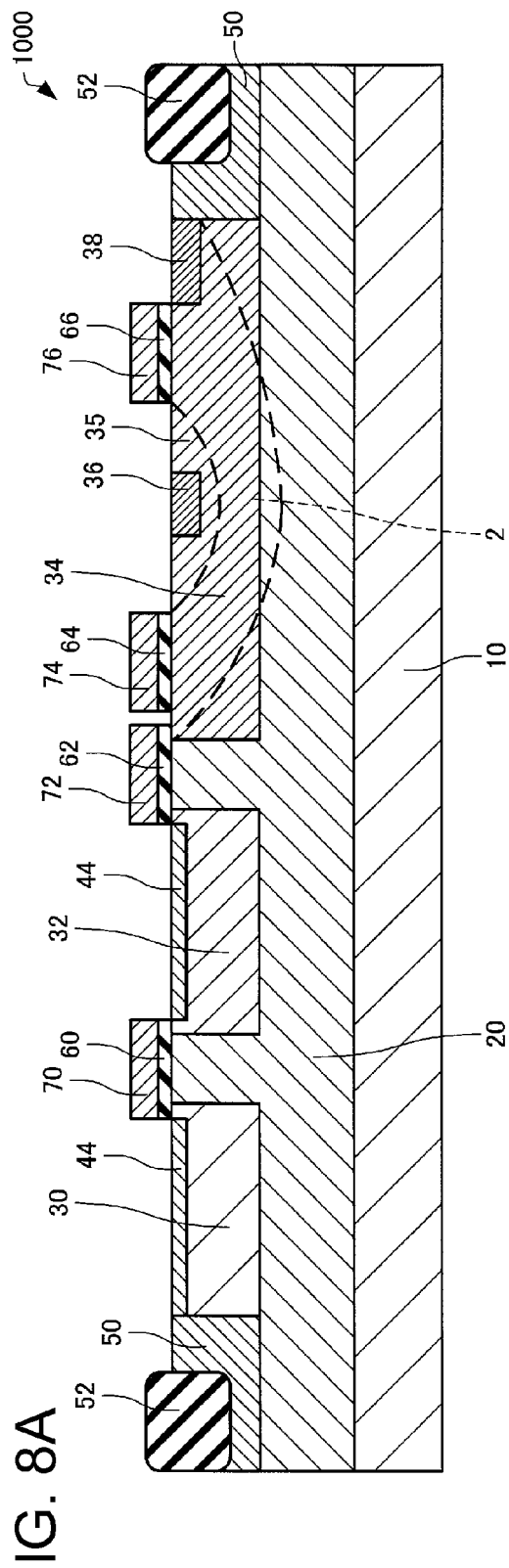
FIGS. 8A and 8B are cross-sectional views schematically showing a solid-state image capturing device according to a comparative example.
Figure 8B:
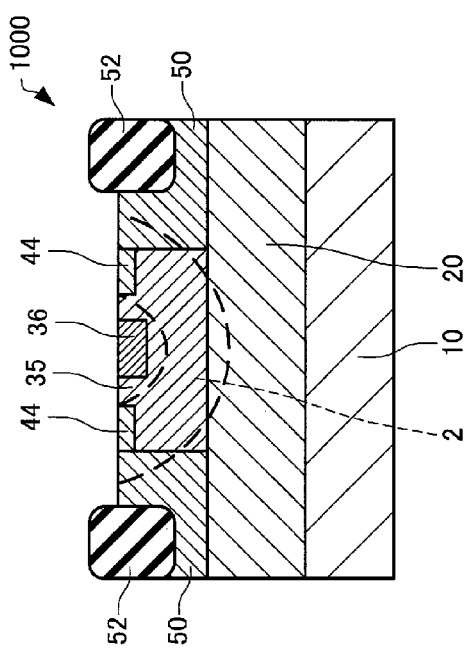

For example, the width of the depletion layer 2 in the solid-state image capturing device 100 according to the present embodiment can be made greater than the width of the depletion layer 2 in a solid-state image capturing device 1000, as shown in FIGS. 8A and 8B, in which the first p-type diffusion layer 40 is not provided below the third n-type diffusion layer 34. Note that FIGS. 8A and 8B are cross-sectional views schematically showing the solid-state image capturing device 1000 according to a comparative example, FIG. 8A corresponds to the cross section shown in FIG. 2, and FIG. 8B corresponds to the cross section shown in FIG. 3.

Furthermore, with the solid-state image capturing device 100, the first p-type diffusion layer 40 is not provided below the first n-type diffusion layer 30 that constitutes a photodiode, and the bottom of the first n-type diffusion layer 30 is in contact with the p-type well 20, for example. For this reason, with the solid-state image capturing device 100, it is possible to suppress a case in which the maximum possible storage amount of carriers (maximum storage charge amount) in the first n-type diffusion layer 30 decreases, and it is furthermore possible to reduce manufacturing variations in the sensitivity of the photodiode.

For example, if a low-concentration p-type diffusion layer is provided below the n-type diffusion layer that constitutes the photodiode, the potential barrier in the p-n junction will decrease, and the carrier amount that can be temporarily stored in the n-type diffusion layer will decrease in some cases. For this reason, the maximum signal level that can be read out using the source follower circuit with respect to the light used for irradiation decreases, incurring a decrease in the dynamic range in some cases. Furthermore, manufacturing variations in the sensitivity of the photodiode increase in some cases.

As described above, the solid-state image capturing device 100 can reduce the capacitance of the floating diffusion layer 35 while suppressing a case in which the maximum storage charge amount of the photodiode decreases.

With the solid-state image capturing device 100, the second p-type diffusion layer 42 is provided between the p-type element isolation region 50 and the third n-type diffusion layer 34, and the impurity concentration of the second p-type diffusion layer 42 is lower than the impurity concentration of the p-type well 20. For this reason, with the solid-state image capturing device 100, the depletion layer 2 can be extended in the lateral direction (direction orthogonal to the thickness direction of the n-type substrate 10) compared to a case where the second p-type diffusion layer 42 is not provided and the side of the third n-type diffusion layer 34 is in contact with the p-type element isolation region 50 (see the solid-state image capturing device 1000 shown in FIGS. 8A and 8B), for example. Accordingly, with the solid-state image capturing device 100, it is possible to further reduce the capacitance of the floating diffusion layer 35.

With the solid-state image capturing device 100, the first p-type diffusion layer 40 overlaps with the third n-type diffusion layer 34 and the second p-type diffusion layer 42 in plan view. Specifically, the area of the first p-type diffusion layer 40 is the same as the sum of the area of the third n-type diffusion layer 34 and the area of the second p-type diffusion layer 42 in plan view. Accordingly, with the solid-state image capturing device 100, the diffusion layers 34, 40, and 42 can be formed by ion implantation using a common resist layer as a mask. As a result, with the solid-state image capturing device 100, the number of manufacturing steps can be reduced compared to the case of forming the diffusion layers 34, 40, and 42 using respective separate resist layers as masks.

The solid-state image capturing device 100 includes a second n-type diffusion layer 32 that is provided in the p-type well 20, is located between the first n-type diffusion layer 30 and the third n-type diffusion layer 34, and stores carriers that are generated in the first n-type diffusion layer 30 and are transferred thereto. For this reason, with the solid-state image capturing device 100, the carriers can be temporarily stored in the second n-type diffusion layer 32, and therefore it is possible to reduce the amount of time it takes to perform readout processing using the source follower circuit 4.

The solid-state image capturing device 100 includes the p-type surface diffusion layers 44, which are provided on the surface of the third n-type diffusion layer 34. For this reason, with the solid-state image capturing device 100, the depletion layer 2 can be extended in the lateral direction, and the capacitance of the floating diffusion layer 35 can be further reduced.

With the solid-state image capturing device 100, the depletion layer 2 extends to the n-type substrate 10. For this reason, when the reset electrode 76 is turned off, for example, even in the case of being irradiated with an excessive amount of light, the depletion layer 2 can effectively discharge the excess carriers flowing into the floating diffusion layer 35 to the n-type substrate 10, and functions as an overflow drain.

Note that with the solid-state image capturing device according to the present embodiment, the conductivities of the semiconductors described above may be reversed. That is to say, with the solid-state image capturing device according to the present invention, the n-type substrate 10 may be a p-type substrate, the p-type well 20 may be an n-type well, the n-type diffusion layers 30, 32, and 34 may be p-type diffusion layers, the n-type high-concentration diffusion layers 36 and 38 may be p-type high-concentration diffusion layers, the p-type diffusion layers 40 and 42 may be n-type diffusion layers, and the p-type element isolation region 50 may be an n-type element isolation region.

2. Manufacturing Method for Solid-State Image Capturing Device

Figure 9:
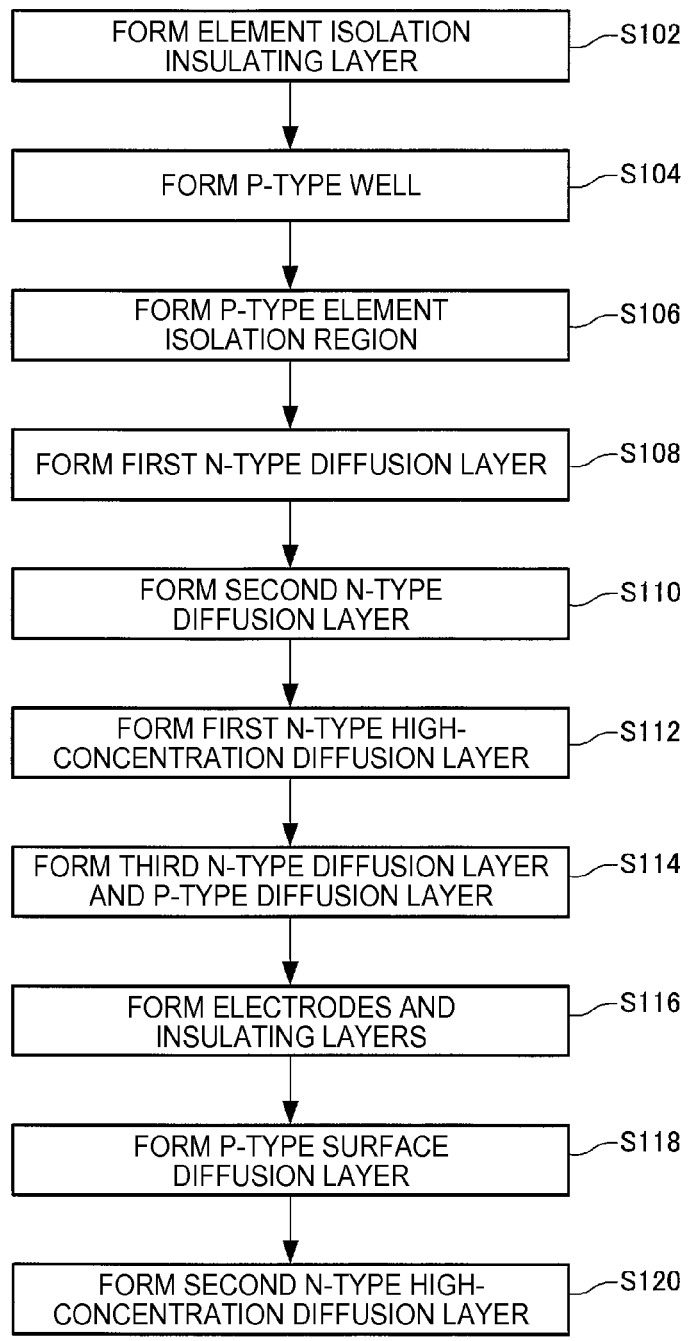
FIG. 9 is a flowchart illustrating a method for manufacturing a solid-state image capturing device according to an embodiment.

Next, a manufacturing method for the solid-state image capturing device 100 according to the present embodiment will be described with reference to the drawings. FIG. 9 is a flowchart illustrating the method of manufacturing the solid-state image capturing device 100 according to the present embodiment. FIGS. 10 to 19 are cross-sectional views schematically showing steps for manufacturing the solid-state image capturing device 100 according to the present embodiment, and correspond to the cross-section shown in FIG. 2.

Figure 10:
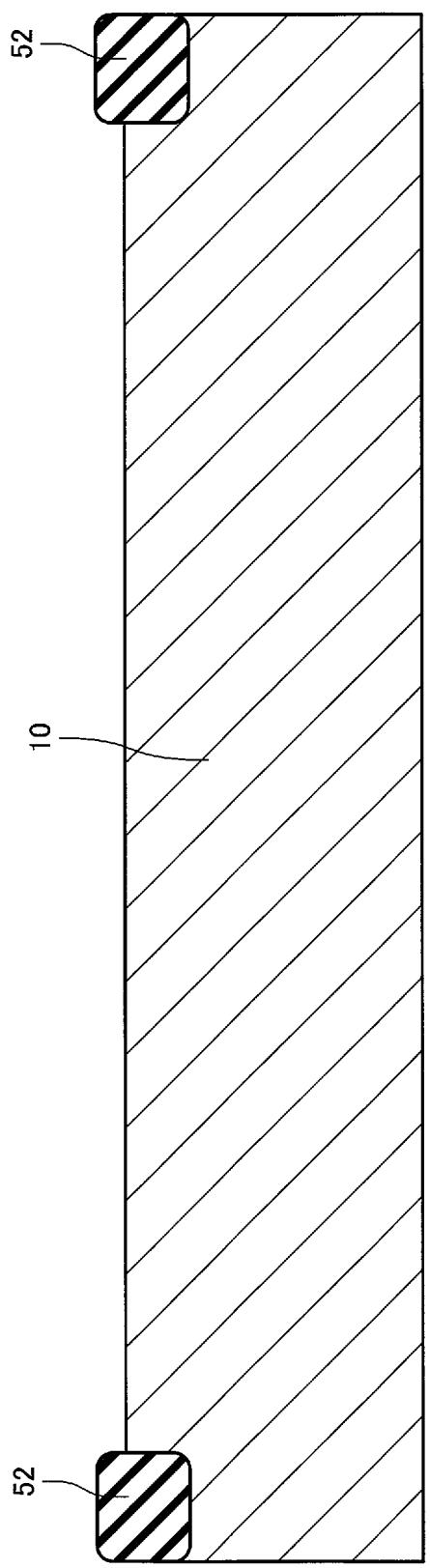
FIG. 10 is a cross-sectional view schematically showing a step of manufacturing a solid-state image capturing device according to an embodiment.

As shown in FIG. 10, the element isolation insulating layer 52 is formed in the n-type substrate 10 (step S102). The element isolation insulating layer 52 is formed using LOCOS, for example.

Figure 11:
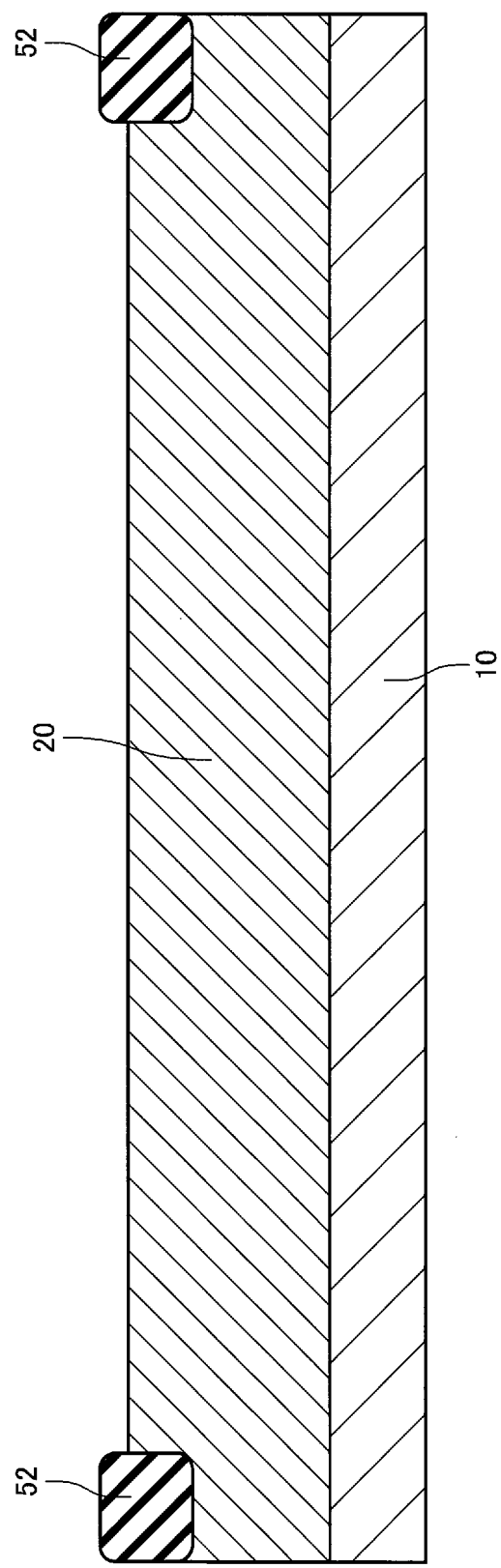
FIG. 11 is a cross-sectional view schematically showing a step of manufacturing a solid-state image capturing device according to an embodiment.

As shown in FIG. 11, the p-type well 20 is formed in the n-type substrate 10 (step S104). The p-type well 20 is formed by implanting boron by ion implantation, for example.

Figure 12:
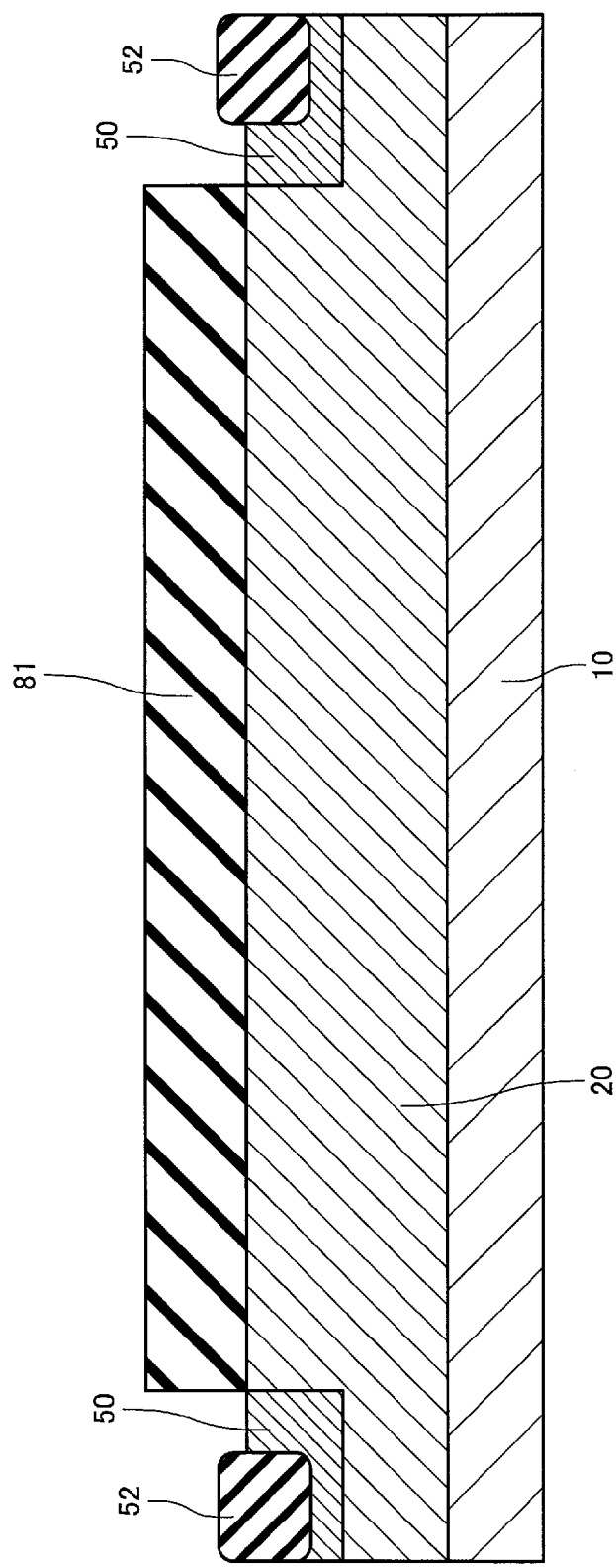
FIG. 12 is a cross-sectional view schematically showing a step of manufacturing a solid-state image capturing device according to an embodiment.

As shown in FIG. 12, the p-type element isolation region 50 is formed on the p-type well 20 (step S106). Specifically, first, a first resist layer 81 with a predetermined shape is formed on the p-type well 20 using photolithography. Next, using the first resist layer 81 as a mask, boron is implanted in the p-type well 20 using ion implantation, for example, and thus the p-type element isolation region 50 is formed. Thereafter, the first resist layer 81 is removed.

Figure 13:
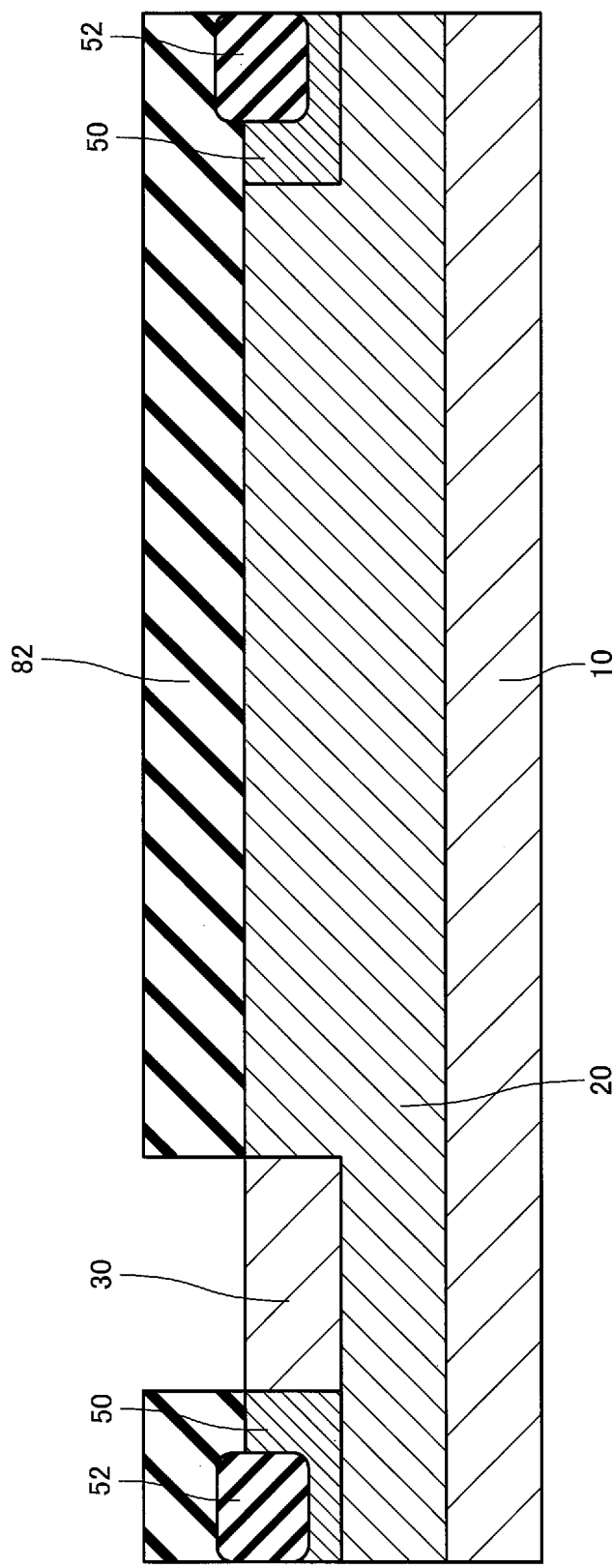
FIG. 13 is a cross-sectional view schematically showing a step of manufacturing a solid-state image capturing device according to an embodiment.

As shown in FIG. 13, the first n-type diffusion layer 30 is formed in the p-type well 20 (step S108). Specifically, first, a second resist layer 82 with a predetermined shape is formed on the p-type well 20 using photolithography. Next, using the second resist layer 82 as a mask, phosphorus is implanted in the p-type well 20 using ion implantation, for example, and thus the first n-type diffusion layer 30 is formed. Thereafter, the second resist layer 82 is removed.

Figure 14:
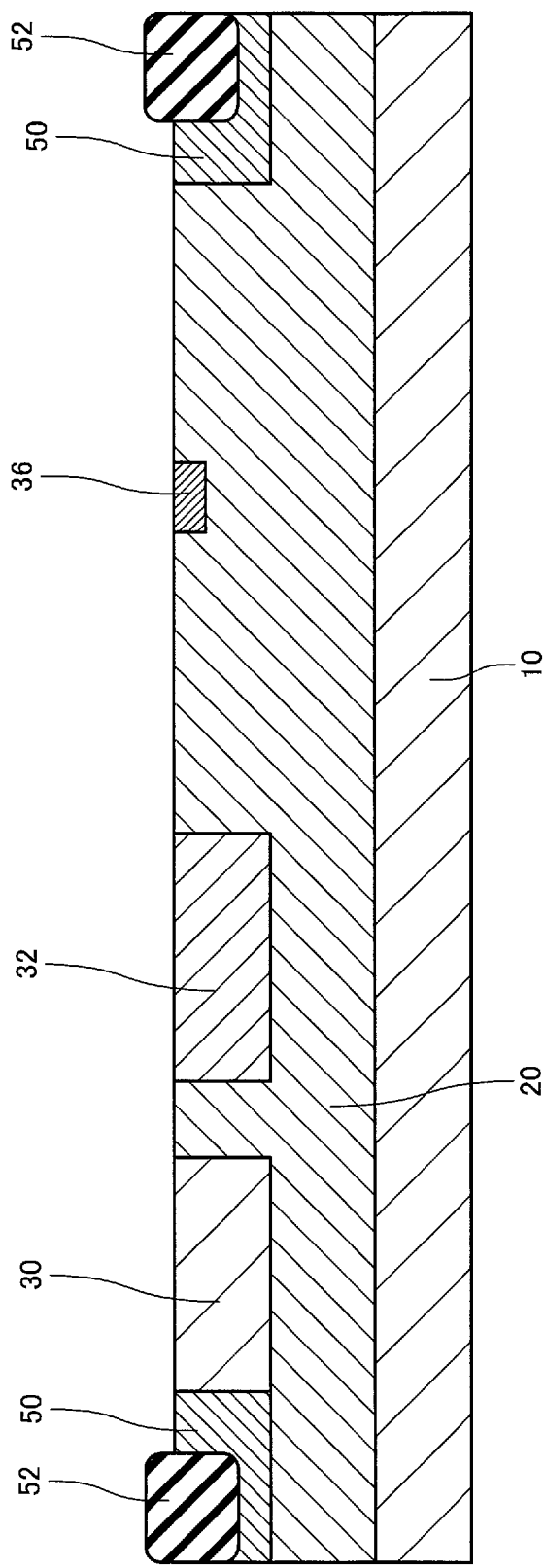
FIG. 14 is a cross-sectional view schematically showing a step of manufacturing a solid-state image capturing device according to an embodiment.

As shown in FIG. 14, the second n-type diffusion layer 32 is formed in the p-type well 20 (step S110). Furthermore, the first n-type high-concentration diffusion layer 36 is formed in the p-type well 20 (step S112). The diffusion layers 32 and 36 are formed by photolithography and implantation of phosphorus using ion implantation, similarly to the first n-type diffusion layer 30, for example.

Figure 15:
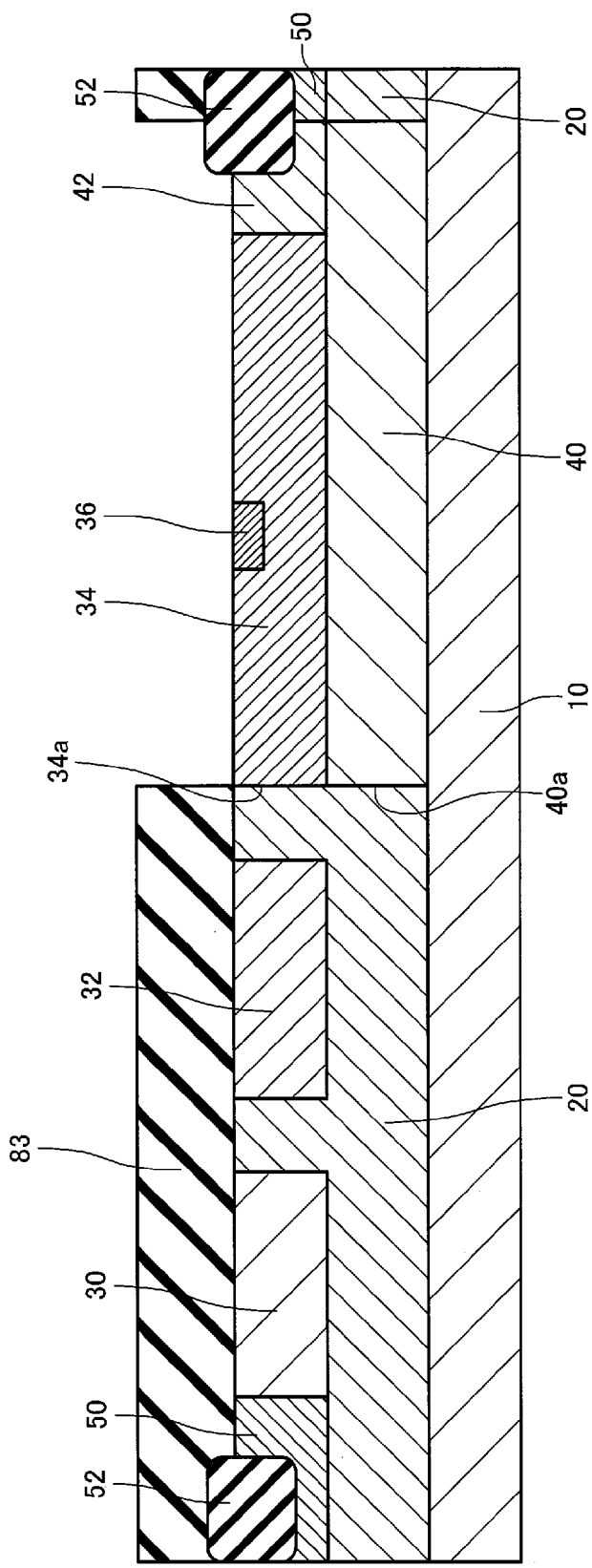
FIG. 15 is a cross-sectional view schematically showing a step of manufacturing a solid-state image capturing device according to an embodiment.

As shown in FIG. 15, the third n-type diffusion layer 34 and the p-type diffusion layers 40 and 42 are formed in the p-type well 20 (step S114). Specifically, a third resist layer 83 with a predetermined shaped is formed on the p-type well 20 using photolithography. The third resist layer 83 is formed so that part of the surface of the p-type element isolation region 50 is exposed. Next, using the third resist layer 83 as a mask, phosphorus is implanted in the p-type well 20 using ion implantation, for example, and the third n-type diffusion layer 34 and the second p-type diffusion layer 42 are formed. The impurity concentration of the p-type element isolation region 50 is higher than the impurity concentration of the p-type well 20. For this reason, even if phosphorus, which is an impurity that forms an n type, is implanted in the p-type element isolation region 50, the p-type element isolation region 50 does not become n type, and the impurity concentration of part of the p-type element isolation region 50 can be reduced. Accordingly, part of the p-type element isolation region 50 can be used as a second p-type diffusion layer 42.

Next, using the third resist layer 83 as a mask, phosphorus is implanted in the p-type well 20 using ion implantation, for example, and thus the first p-type diffusion layer 40 is formed. With this ion implantation, the impurity concentration of part of the p-type well 20 can be reduced, and part of the p-type well 20 can be used as the first p-type diffusion layer 40. The ion implantation for forming the first p-type diffusion layer 40 is performed with higher acceleration energy than that in the ion implantation for forming the diffusion layers 34 and 42. Accordingly, the first p-type diffusion layer 40 can be formed under the diffusion layers 34 and 42. For example, the acceleration energy in the ion implantation for forming the diffusion layers 34 and 42 is 100 keV or more and 5000 keV or less, and the acceleration energy in the ion implantation for forming the first p-type diffusion layer 40 is 500 keV or more and 2000 keV or less.

As described above, the diffusion layers 34, 40, and 42 are formed by ion implantation using a common resist layer (third resist layer 83) as a mask. Accordingly, the side surface 34a of the third n-type diffusion layer 34 and the side surface 40a of the first p-type diffusion layer 40 are connected. Thereafter, the third resist layer 83 is removed.

Note that an example was described above in which the diffusion layers 34 and 42 are formed first and then the first p-type diffusion layer 40 is formed, but there is no particular limitation to the sequence of forming the diffusion layers 34 and 42 and the first p-type diffusion layer 40.

Also, there is no particular limitation to the sequence of the step of forming the first n-type diffusion layer 30, the step of forming the second n-type diffusion layer 32, the diffusion layers 34, 40, and 42, and the step of forming the first n-type high-concentration diffusion layer 36.

Figure 16:
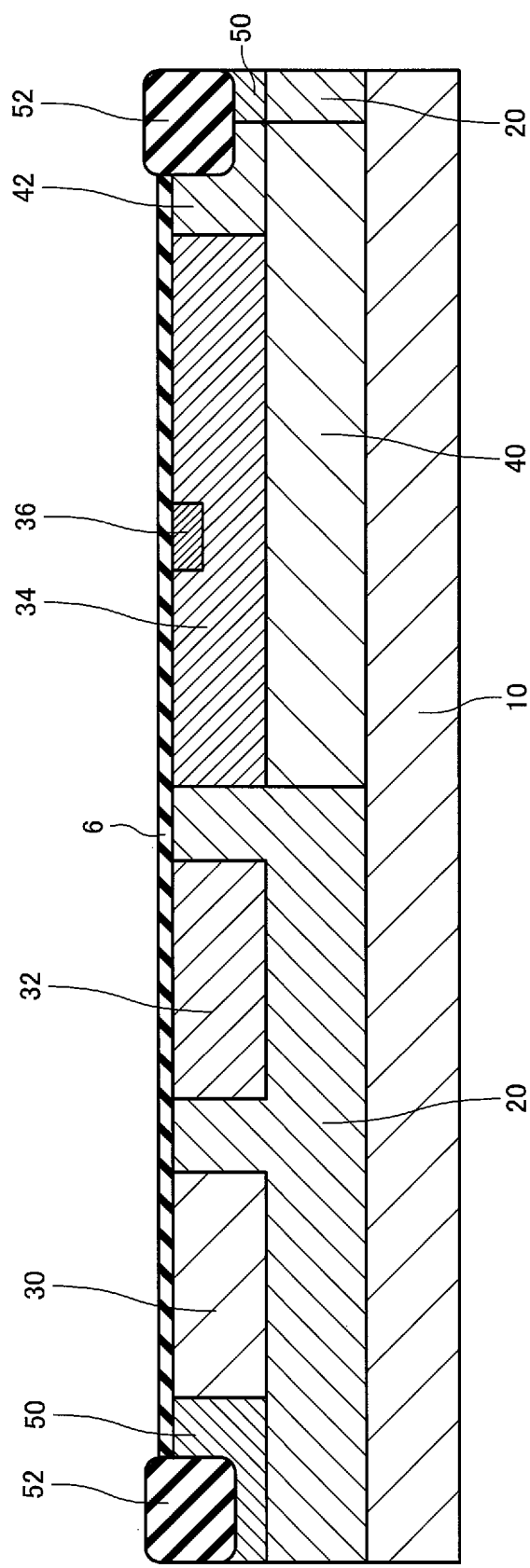
FIG. 16 is a cross-sectional view schematically showing a step of manufacturing a solid-state image capturing device according to an embodiment.

As shown in FIG. 16, the insulating layer 6 is formed on the surface of the n-type substrate 10 (surface of the p-type well 20). The insulating layer 6 is formed by thermal oxidation, for example.

Figure 17:
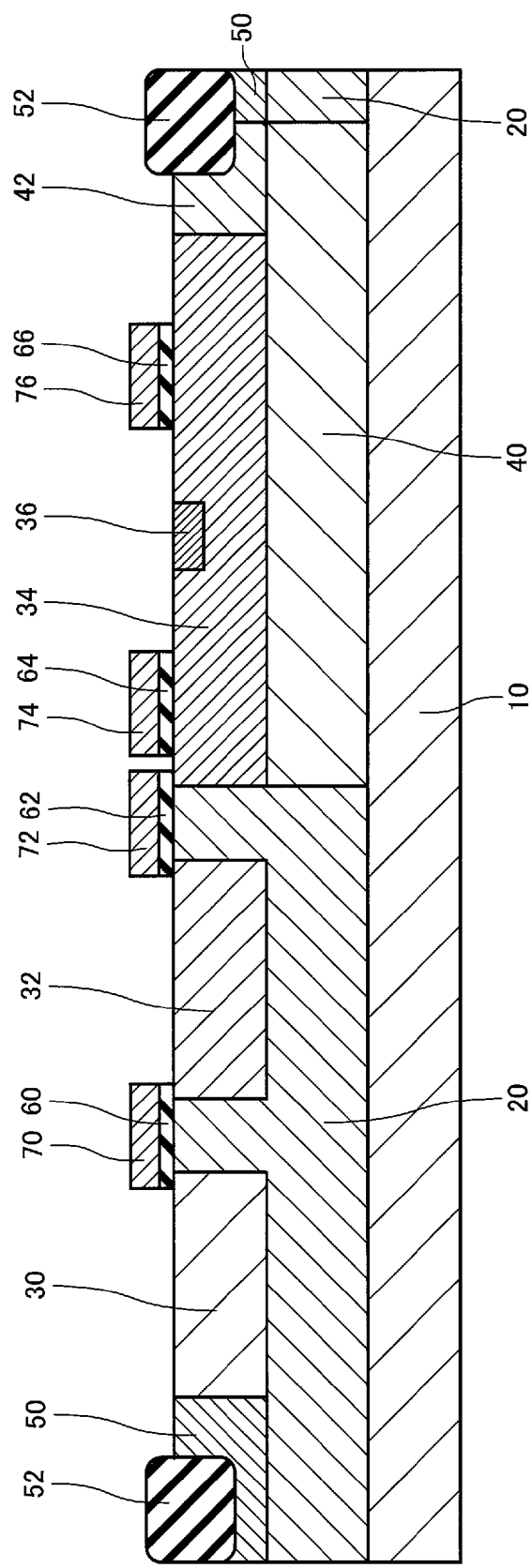
FIG. 17 is a cross-sectional view schematically showing a step of manufacturing a solid-state image capturing device according to an embodiment.

As shown in FIG. 17, a conductive layer (not shown) is formed on the insulating layer 6 and the conductive layer and the insulating layer 6 are patterned so as to form the electrodes 70, 72, 74, and 76 and the insulating layers 60, 62, 62, 64, and 66 (step S116). Patterning is performed using photolithography and etching, for example.

Figure 18:
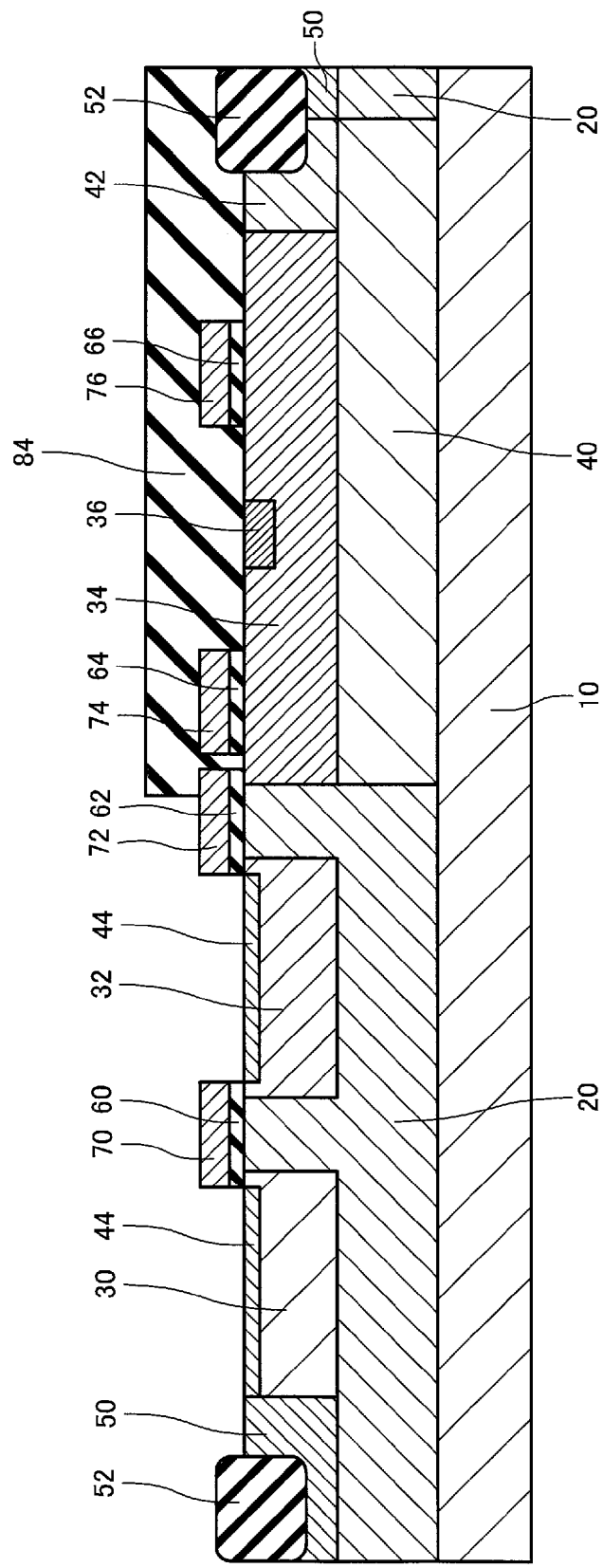
FIG. 18 is a cross-sectional view schematically showing a step of manufacturing a solid-state image capturing device according to an embodiment.

As shown in FIG. 18, the p-type surface diffusion layers 44 are formed on the surfaces of the n-type diffusion layers 30 and 32 (step S118). Furthermore, as shown in FIG. 3, the p-type surface diffusion layers 44 are formed on the surface of the third n-type diffusion layer 34. Specifically, first, a fourth resist layer 84 with a predetermined shape is formed on the p-type well 20 using photolithography. Next, using the fourth resist layer 84 as a mask, boron is implanted in the n-type diffusion layers 30, 32, and 34 using ion implantation, for example, and thus the p-type surface diffusion layers 44 are formed. The p-type surface diffusion layers 44 on the surfaces of the n-type diffusion layers 30 and 32 are formed in a self-aligned manner using the transfer electrodes 70 and 72, for example. Thereafter, the fourth resist layer 84 is removed.

Figure 19:
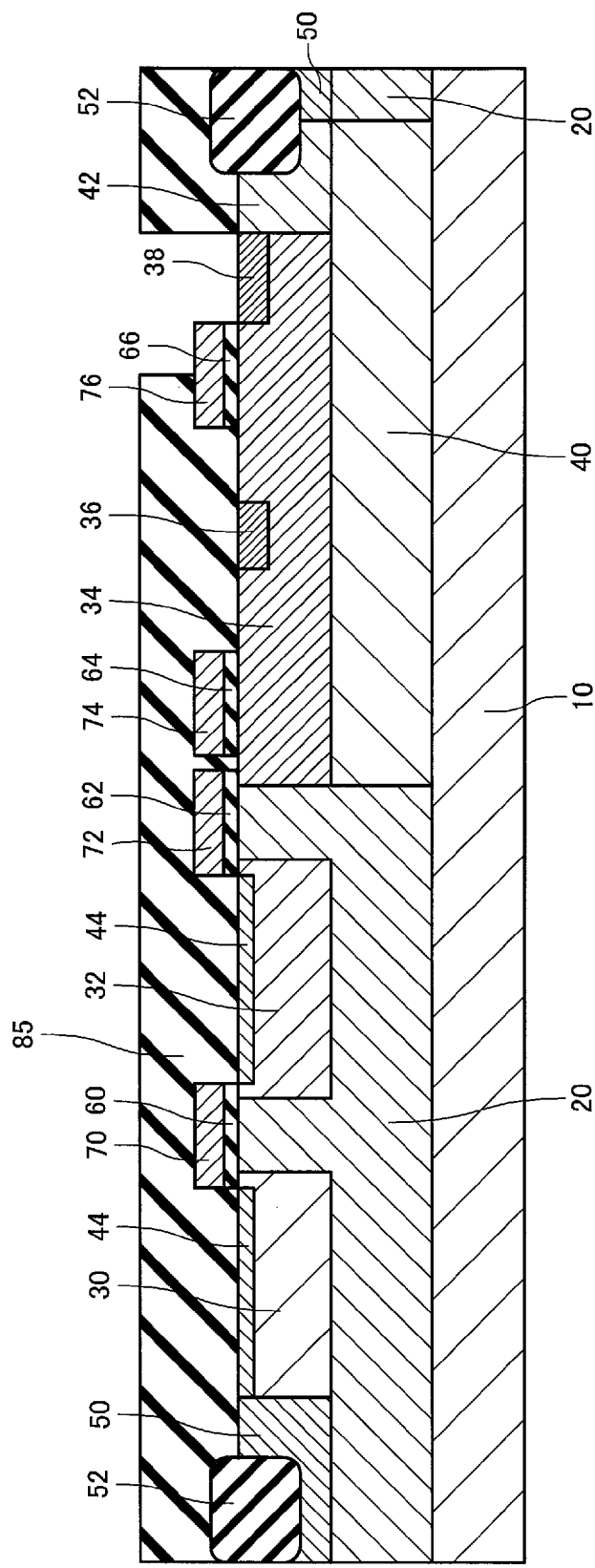
FIG. 19 is a cross-sectional view schematically showing a step of manufacturing a solid-state image capturing device according to an embodiment.

As shown in FIG. 19, the second n-type high-concentration diffusion layer 38 is formed in the third n-type diffusion layer 34 (step S120). Specifically, first, a fifth resist layer 85 with a predetermined shape is formed on the p-type well 20 using photolithography. Next, using the fifth resist layer 85 as a mask, boron is implanted in the third n-type diffusion layer 34 using ion implantation, for example, and thereby the second n-type high-concentration diffusion layer 38 is formed. The second n-type high-concentration diffusion layer 38 is formed in a self-aligned manner using the reset electrode 76, for example. Thereafter, the fifth resist layer 85 is removed.

The solid-state image capturing device 100 can be manufactured using the steps above.

The manufacturing method for the solid-state image capturing device 100 has the following characteristics, for example.

With the manufacturing method for the solid-state image capturing device 100, it is possible to manufacture the solid-state image capturing device 100, which can reduce the capacitance of the floating diffusion layer 35 while suppressing a case in which and the maximum storage charge amount of the photodiode decreases.

With the manufacturing method for the solid-state image capturing device 100, the diffusion layers 34, 40, and 42 are formed by ion implantation using a common resist layer (third resist layer 83) as a mask. For this reason, with the manufacturing method for the solid-state image capturing device 100, it is possible to reduce the number of manufacturing steps in comparison to a case where the diffusion layers 34, 40, and 42 are formed using respective separate resist layers as masks.

Figure 20:
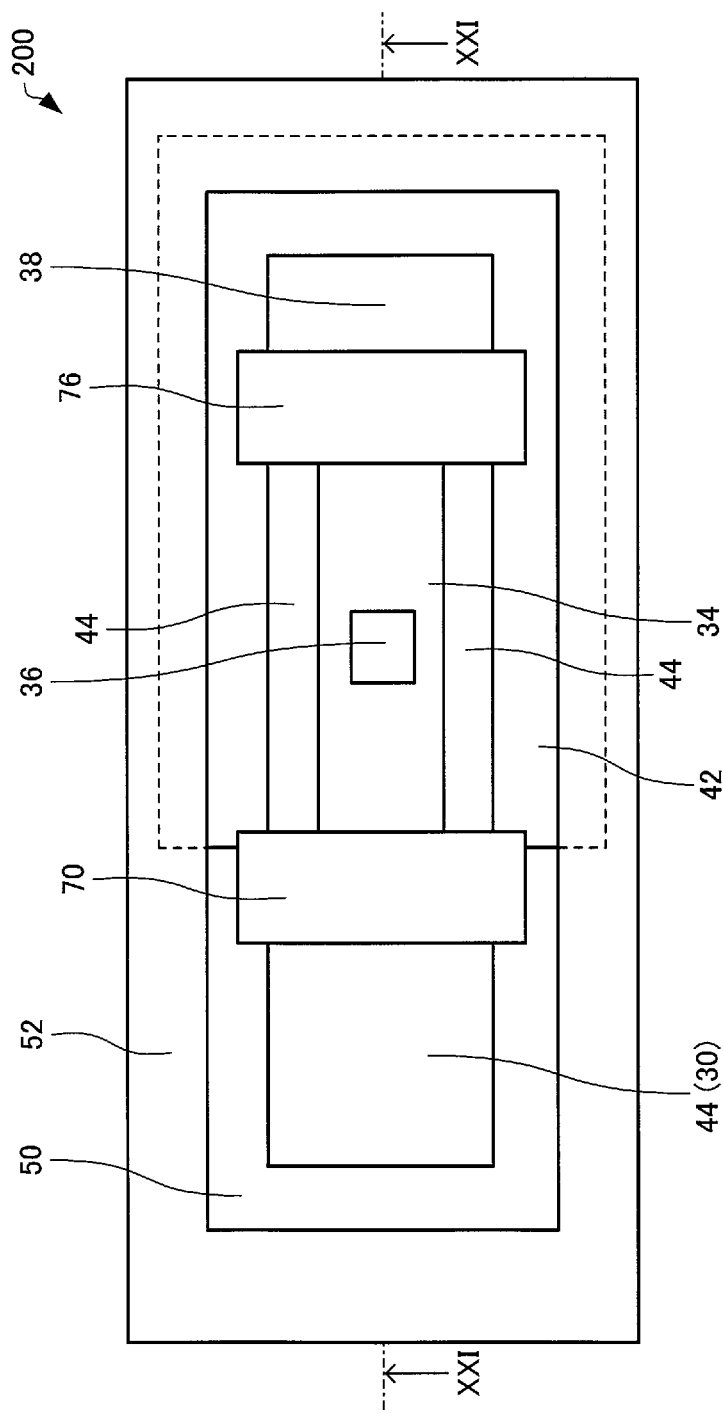
FIG. 20 is a plan view schematically showing a solid-state image capturing device according to a first modified example of an embodiment.
Figure 21:
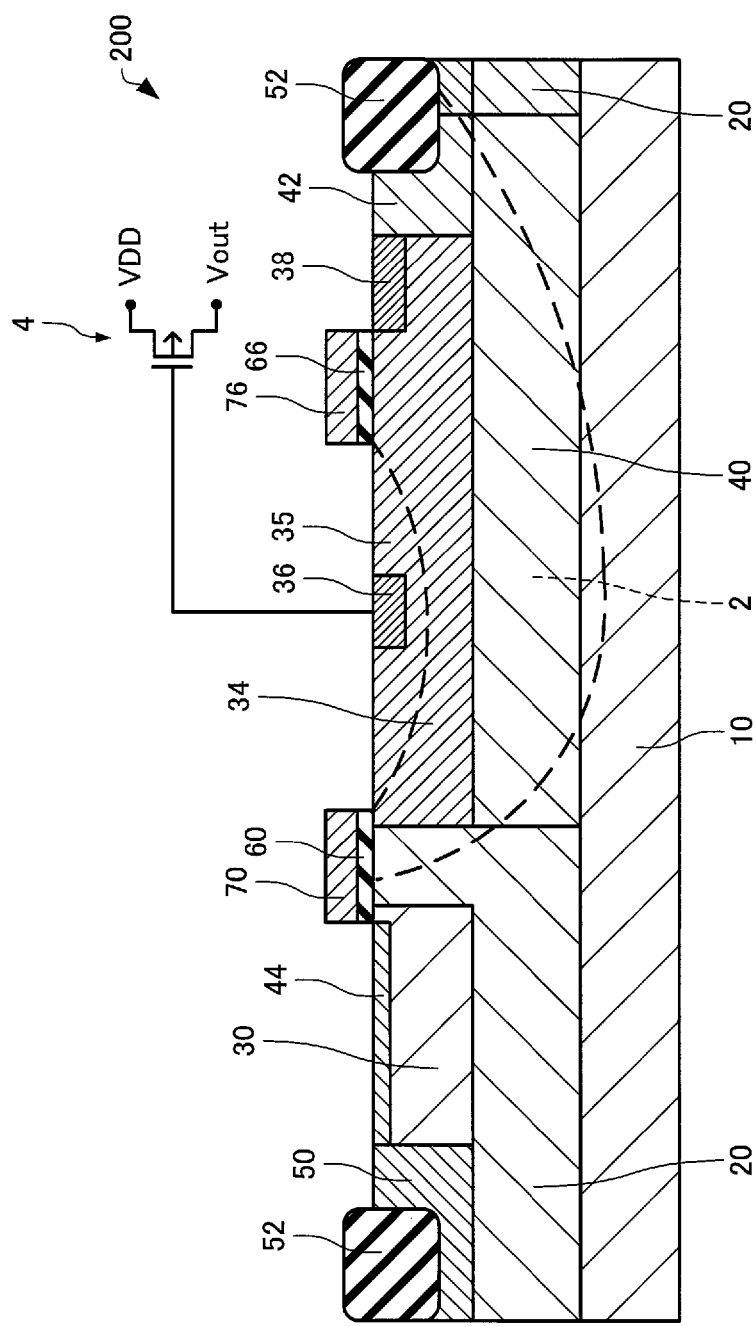
FIG. 21 is a cross-sectional view schematically showing a solid-state image capturing device according to a first modified example of an embodiment.

3. Modified Examples of Solid-State Image Capturing Device 3.1. First Modified Example Next, a solid-state image capturing device according to a first modified example of the present embodiment will be described with reference to the drawings. FIG. 20 is a plan view schematically showing a solid-state image capturing device 200 according to the first modified example of the present embodiment. FIG. 21 is a cross-sectional view taken along line XXI-XXI in FIG. 20, which schematically shows the solid-state image capturing device 200 according to the first modified example of the present embodiment.

Hereinafter, in the solid-state image capturing device 200 according to the first modified example of the present embodiment, members having functions similar to those of constituent members of the solid-state image capturing device 100 according to the present embodiment are denoted by the same reference numerals, and detailed description thereof is omitted. The same follows for a solid-state image capturing device according to a second modified example of the present embodiment, which will be described below.

The above-described solid-state image capturing device 100 is provided with the second n-type diffusion layer 32, the insulating layers 62 and 64, and the electrodes 72 and 74, as shown in FIGS. 1 and 2. In contrast, the solid-state image capturing device 200 is not provided with the second n-type diffusion layer 32, the insulating layers 62 and 64, and the electrodes 72 and 74, as shown in FIGS. 20 and 21. With the solid-state image capturing device 200, the carriers generated in the first n-type diffusion layers 30 are not transferred to the third n-type diffusion layer 34 via the second n-type diffusion layer 32.

As described above, the solid-state image capturing device 200 is not provided with the second n-type diffusion layer 32, and therefore, as a result, it is possible to achieve a smaller size.

3.2. Second Modified Example

Figure 22:
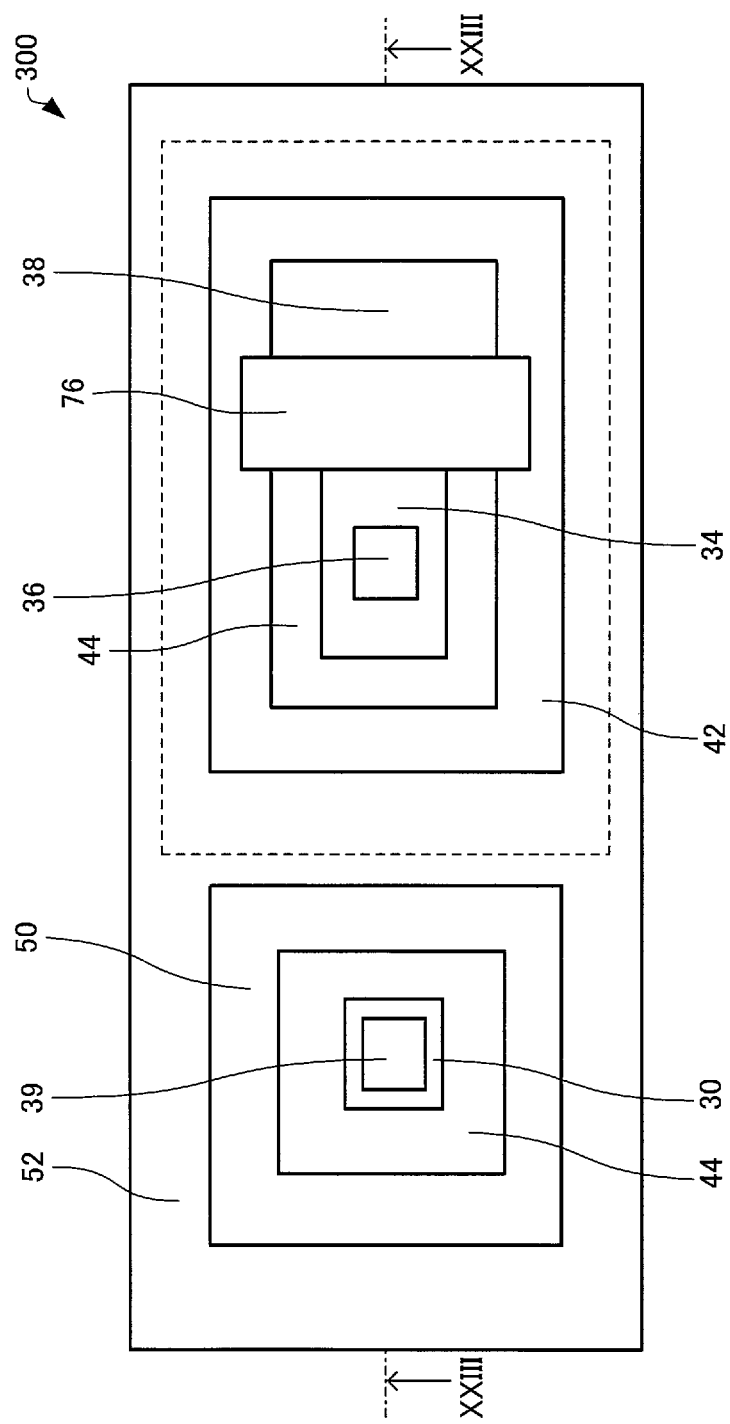
FIG. 22 is a plan view schematically showing a solid-state image capturing device according to a second modified example of an embodiment.
Figure 23:
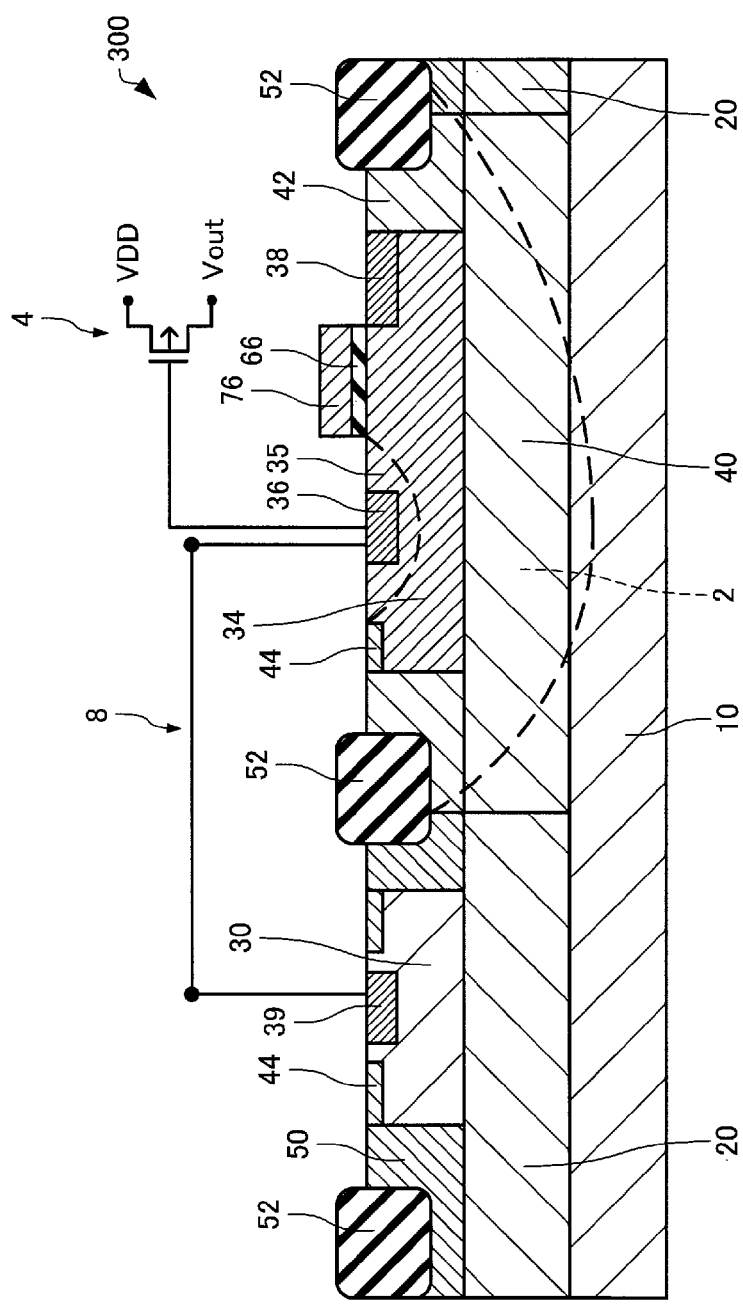
FIG. 23 is a cross-sectional view schematically showing a solid-state image capturing device according to a second modified example of an embodiment.

Next, a solid-state image capturing device according to a second modified example of the present embodiment will be described with reference to the drawings. FIG. 22 is a plan view schematically showing a solid-state image capturing device 300 according to the second modified example of the present embodiment. FIG. 23 is a cross-sectional view taken along line XXIII-XXIII in FIG. 22, which schematically shows the solid-state image capturing device 300 according to the second modified example of the present embodiment.

As shown in FIGS. 1 and 2, the above-described solid-state image capturing device 100 is provided with the second n-type diffusion layer 32, the insulating layers 60, 62, and 64, and the electrodes 70, 72, and 74. In contrast, as shown in FIGS. 22 and 23, the solid-state image capturing device 300 is not provided with the second n-type diffusion layer 32, the insulating layers 60, 62, and 64, and the electrodes 70, 72, and 74.

The solid-state image capturing device 300 is provided with a third n-type high-concentration diffusion layer 39 in the first n-type diffusion layer 30. The third n-type high-concentration diffusion layer 39 is a region composed of an n-type semiconductor formed by adding an impurity such as phosphorus to silicon, for example. The impurity concentration of the third n-type high-concentration diffusion layer 39 is higher than the impurity concentration of the first n-type diffusion layer 30. In the example shown in the drawings, the depth of the third n-type high-concentration diffusion layer 39 is the same as the depth of the first n-type high-concentration diffusion layer 36.

The first n-type high-concentration diffusion layer 36 and the third n-type high-concentration diffusion layer 39 are electrically connected. Accordingly, the first n-type diffusion layer 30 and the third n-type diffusion layer 34 are electrically connected. In the example shown in the drawing, the third n-type high-concentration diffusion layer 39 and the first n-type high-concentration diffusion layer 36 are connected by an interconnect 8.

With the solid-state image capturing device 300, carriers (charges) generated in the first n-type diffusion layer 30 due to irradiation with light are read out using the source follower circuit 4 via the interconnect 8. That is to say, the carriers generated in the first n-type diffusion layer 30 are not transferred to the third n-type diffusion layer 34.

As described above, with the solid-state image capturing device 300, the carriers (charges) generated in the first n-type diffusion layer 30 due to irradiation with light can be read out using the source follower circuit 4 without being transferred to the third n-type diffusion layer 34.

The above-described embodiment and modified examples are exemplary, and there is no limitation thereto. For example, it is possible to combine the embodiment and modified examples as appropriate.

The present invention encompasses configurations that are substantially identical to the configurations described in the embodiments (e.g., configurations with identical functions, methods, and results, or configurations with identical objects and effects). Also, the present invention encompasses configurations in which non-substantial portions of the configurations described in the embodiments are replaced. Also, the present invention encompasses configurations that achieve effects that are identical to those of the configurations described in the embodiments, or configurations that achieve identical objects. Also, the present invention encompasses configurations obtained by adding known techniques to configurations described in the embodiments.

The entire disclosure of Japanese Patent Application No. 2014-237775, filed Nov. 25, 2014 is expressly incorporated by reference herein.

What is claimed is:

1. A solid-state image capturing device comprising:
a first-conductivity-type well;
a first second-conductivity-type diffusion layer that is provided in the first-conductivity-type well and generates carriers upon being irradiated with light;
a second second-conductivity-type diffusion layer that is provided in the first-conductivity-type well and is connected to the first second-conductivity-type diffusion layer via a carrier conduction path; and
a first first-conductivity-type diffusion layer provided below the second second-conductivity-type diffusion layer,
wherein an impurity concentration of the second second-conductivity-type diffusion layer is higher than an impurity concentration of the first second-conductivity-type diffusion layer,
an impurity concentration of the first first-conductivity-type diffusion layer is lower than an impurity concentration of the first-conductivity-type well, and
the second second-conductivity-type diffusion layer constitutes a floating diffusion layer.

2. The solid-state image capturing device according to claim 1, comprising:
a first-conductivity-type element isolation region provided around the first second-conductivity-type diffusion layer and the second second-conductivity-type diffusion layer;
a second first-conductivity-type diffusion layer provided between the first-conductivity-type element isolation region and the second second-conductivity-type diffusion layer,
wherein an impurity concentration of the first-conductivity-type element isolation region is higher than the impurity concentration of the first-conductivity-type well, and
an impurity concentration of the second first-conductivity-type diffusion layer is lower than the impurity concentration of the first-conductivity-type well.

3. The solid-state image capturing device according to claim 2,
wherein in plan view, the first first-conductivity-type diffusion layer overlaps with the second second-conductivity-type diffusion layer and the second first-conductivity-type diffusion layer.

4. The solid-state image capturing device according to claim 1, comprising:
a third second-conductivity-type diffusion layer that is provided in the first-conductivity-type well, is located between the first second-conductivity-type diffusion layer and the second second-conductivity-type diffusion layer, and stores carriers that are generated in the first second-conductivity-type diffusion layer and are transferred thereto,
wherein an impurity concentration of the third second-conductivity-type diffusion layer is higher than the impurity concentration of the first second-conductivity-type diffusion layer and lower than the impurity concentration of the second second-conductivity-type diffusion layer, and
carriers generated in the first second-conductivity-type diffusion layer are transferred to the second second-conductivity-type diffusion layer via the third second-conductivity-type diffusion layer.

5. The solid-state image capturing device according to claim 1, comprising:
a first insulating layer provided on the first-conductivity-type well between the first second-conductivity-type diffusion layer and the second second-conductivity-type diffusion layer; and
a first electrode that is provided on the first insulating layer and is for transferring carriers generated in the first second-conductivity-type diffusion layer to the second second-conductivity-type diffusion layer.

6. The solid-state image capturing device according to claim 1, comprising:

a reset insulating layer provided on the second second-conductivity-type diffusion layer; and a reset electrode that is provided on the second insulating layer and is for discharging carriers stored in the second second-conductivity-type diffusion layer.

7. The solid-state image capturing device according to claim 1, comprising:

a first-conductivity-type surface diffusion layer provided on a surface of the first second-conductivity-type diffusion layer.

8. A solid-state image capturing device, comprising:

a first-conductivity-type well;

a first second-conductivity-type diffusion layer that is provided in the first-conductivity-type well and generates carriers upon being irradiated with light;

a second second-conductivity-type diffusion layer that is provided in the first-conductivity-type well and is electrically connected to the first second-conductivity-type diffusion layer; and a first first-conductivity-type diffusion layer provided below the second second-conductivity-type diffusion layer, wherein an impurity concentration of the second second-conductivity-type diffusion layer is higher than an impurity concentration of the first second-conductivity-type diffusion layer, an impurity concentration of the first first-conductivity-type diffusion layer is lower than an impurity concentration of the first-conductivity-type well, the second second-conductivity-type diffusion layer constitutes a floating diffusion layer.

9. A manufacturing method for a solid-state image capturing device, comprising:

forming a first-conductivity-type well in a substrate;

forming a first second-conductivity-type diffusion layer in the first-conductivity-type well;

forming a second second-conductivity-type diffusion layer in the first-conductivity-type well; and forming a first first-conductivity-type diffusion layer in the first-conductivity-type well, wherein the first first-conductivity-type diffusion layer is formed below the second second-conductivity-type diffusion layer, an impurity concentration of the second second-conductivity-type diffusion layer is higher than an impurity concentration of the first second-conductivity-type diffusion layer, and an impurity concentration of the first first-conductivity-type diffusion layer is lower than an impurity concentration of the first-conductivity-type well, the first second-conductivity-type diffusion layer generates carriers upon being irradiated with light, the second second-conductivity-type diffusion layer is connected to the first second-conductivity-type diffusion layer via a carrier conduction path, and the second second-conductivity-type diffusion layer constitutes a floating diffusion layer.

10. The method of manufacturing a solid-state image capturing device according to claim 9, wherein the second second-conductivity-type diffusion layer and the first first-conductivity-type diffusion layer are formed by ion implantation using a common resist layer as a mask.

11. The solid-state image capturing device according to claim 1, wherein the second second-conductivity-type diffusion layer stores carriers that are generated in the first second-conductivity-type diffusion layer and are transferred to the second second-conductivity-type diffusion layer.

12. The solid-state image capturing device according to claim 1, wherein the second second-conductivity-type diffusion layer is electrically connected to the first second-conductivity-type diffusion layer by an interconnect.

* * * * *